(12) United States Patent
Lee et al.

(10) Patent No.: US 11,882,717 B2
(45) Date of Patent: Jan. 23, 2024

(54) DISPLAY DEVICE HAVING AN AUXILIARY WIRING

(71) Applicant: LG Display Co., Ltd., Seoul (KR)

(72) Inventors: Jin Bok Lee, Paju-si (KR); Yong Il Kim, Dangjin-si (KR)

(73) Assignee: LG DISPLAY CO., LTD., Seoul (KR)

( * ) Notice: Subject to any disclaimer, the term of this patent is extended or adjusted under 35 U.S.C. 154(b) by 232 days.

(21) Appl. No.: 17/344,648

(22) Filed: Jun. 10, 2021

(65) Prior Publication Data

US 2021/0408441 A1 Dec. 30, 2021

(30) Foreign Application Priority Data

Jun. 24, 2020 (KR) ........................ 10-2020-0077173

(51) Int. Cl.
| | |
|---|---|
| *H10K 50/824* | (2023.01) |
| *H10K 50/814* | (2023.01) |
| *H10K 59/123* | (2023.01) |
| *H10K 59/124* | (2023.01) |
| *H10K 59/126* | (2023.01) |
| *H10K 59/131* | (2023.01) |
| *H10K 71/00* | (2023.01) |
| *H10K 50/818* | (2023.01) |
| *H10K 50/828* | (2023.01) |
| *H10K 59/122* | (2023.01) |
| *H10K 59/12* | (2023.01) |
| *H10K 102/00* | (2023.01) |

(52) U.S. Cl.
CPC ......... *H10K 50/824* (2023.02); *H10K 50/814* (2023.02); *H10K 59/123* (2023.02); *H10K 59/124* (2023.02); *H10K 59/126* (2023.02); *H10K 59/1315* (2023.02); *H10K 71/00* (2023.02); *H10K 50/818* (2023.02); *H10K 50/828* (2023.02); *H10K 59/1201* (2023.02); *H10K 59/122* (2023.02); *H10K 2102/3026* (2023.02)

(58) Field of Classification Search
CPC .. H10K 50/824; H10K 50/814; H10K 59/126; H10K 59/124; H10K 59/122; H10K 2102/3026; H10K 50/818; H01K 59/1315; H01K 59/123
USPC .......................................................... 257/40
See application file for complete search history.

(56) References Cited

U.S. PATENT DOCUMENTS

| | | | |
|---|---|---|---|
| 2013/0099218 A1* | 4/2013 | Lee ................... | H10K 50/11 438/22 |
| 2013/0256638 A1* | 10/2013 | Uesugi ............. | H10K 50/824 438/34 |
| 2015/0090989 A1 | 4/2015 | Matsumoto et al. | |

FOREIGN PATENT DOCUMENTS

| | | |
|---|---|---|
| KR | 10-2016-0006110 A | 1/2018 |
| KR | 10-2018-0014404 A | 2/2018 |
| KR | 10-2018-0077767 A | 7/2018 |

* cited by examiner

*Primary Examiner* — Xia L Cross
(74) *Attorney, Agent, or Firm* — Birch, Stewart, Kolasch & Birch, LLP

(57) ABSTRACT

Discussed is a display device capable of preventing lowering in a cathode voltage by the provision of an auxiliary connection portion and improving both the transmission efficiency of a transmissive portion and the luminance of an emission portion in a structure having both the transmissive portion and the emission portion.

15 Claims, 13 Drawing Sheets

DISPLAY DEVICE HAVING AN AUXILIARY WIRING

CROSS-REFERENCE TO RELATED APPLICATIONS

This application claims the benefit of priority to Korean Patent Application No. 10-2020-0077173, filed on Jun. 24, 2020 in the Republic of Korea, the entire contents of which are hereby expressly incorporated by reference as if fully set forth herein into the present application.

BACKGROUND OF THE INVENTION

Field of the Invention

The present invention relates to a display device, and more particularly to a display device capable of preventing lowering in a cathode voltage by the provision of an auxiliary connection portion and improving both the transmission efficiency of a transmissive portion and the luminance of an emission portion in a structure having both the transmissive portion and the emission portion.

Discussion of the Related Art

Recently, with the advent of the information age, the field of displays that visually display electrical information signals has developed rapidly. In response to this, various kinds of display devices having excellent characteristics, such as a small thickness, a low weight, and low power consumption, have been developed and have rapidly replaced existing cathode ray tubes (CRTs).

Among such display devices, a self-emissive display device having a light-emitting device in a display panel is considered a competitive application because it does not require a separate light source and enables realization of a compact device design and vivid color display.

Meanwhile, in a display device, one electrode of a light-emitting device provided for each subpixel is provided as a single body over an active area, whereby an auxiliary connection portion is necessary in order to prevent lowering in the voltage at a region of an electrode formed as a single body for a plurality of subpixels distant from a region of the electrode to which a voltage is applied.

SUMMARY OF THE INVENTION

Accordingly, the present invention is directed to a display device that substantially obviates one or more problems due to limitations and disadvantages of the related art.

It is an object of the present invention to provide a display device capable of preventing lowering in a cathode voltage by the provision of an auxiliary connection portion and improving both the transmission efficiency of a transmissive portion and luminance of an emission portion in a structure having both the transmissive portion and the emission portion.

Additional advantages, objects, and features of the invention will be set forth in part in the description which follows and in part will become apparent to those having ordinary skill in the art upon examination of the following or can be learned from practice of the invention. The objectives and other advantages of the invention can be realized and attained by the structure particularly pointed out in the written description and claims hereof as well as the appended drawings.

In a display device according to the present invention having a structure in which a highly reflective metal is included in a first electrode, the construction of an auxiliary connection portion is changed in order to improve the efficiency of an emission portion.

To achieve these objects and other advantages and in accordance with the purpose of the invention, as embodied and broadly described herein, a display device includes a substrate including a plurality of pixels, each of which has an emission portion and a non-emission portion disposed around the emission portion, a light-emitting device at the emission portion of the substrate, the light-emitting device including a first electrode, an organic emissive layer over the first electrode, and a second electrode disposed over the organic emissive layer, an auxiliary electrode lower than the first electrode at the non-emission portion, the auxiliary electrode including a first metal layer and a second metal layer on the first metal layer, the second metal layer having a smaller area than the first metal layer, a passivation film disposed to protrude more than the second metal layer, the passivation film to expose a part of the first metal layer, and a gap portion at the side of the second metal layer between the passivation film and the first metal layer, wherein the second electrode is introduced into the gap portion in the non-emission portion to be connected to the first metal layer of the auxiliary electrode.

In another aspect of the present invention, a display device includes a substrate including a plurality of pixels, each of which has a plurality of emission portions to emit different colors and a transmissive portion neighboring the plurality of emission portions, a first electrode at each of the plurality of emission portions, an auxiliary electrode at a non-emission portion, the auxiliary electrode including a first metal layer and a second metal layer on the first metal layer, the second metal layer having a smaller area than the first metal layer, a passivation film over the second metal layer to protrude more than the second metal layer, the passivation film to expose a part of the first metal layer, a gap portion at the side of the second metal layer between the passivation film and the first metal layer, a bank to expose the gap portion and a part of the first metal layer on the passivation film, the bank at the non-emission portion, an organic layer over the bank and the exposed first metal layer, and a second electrode over the organic layer, a part of the second electrode being introduced into the gap portion to be connected to the first metal layer.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE EMBODIMENTS

Figure 1:
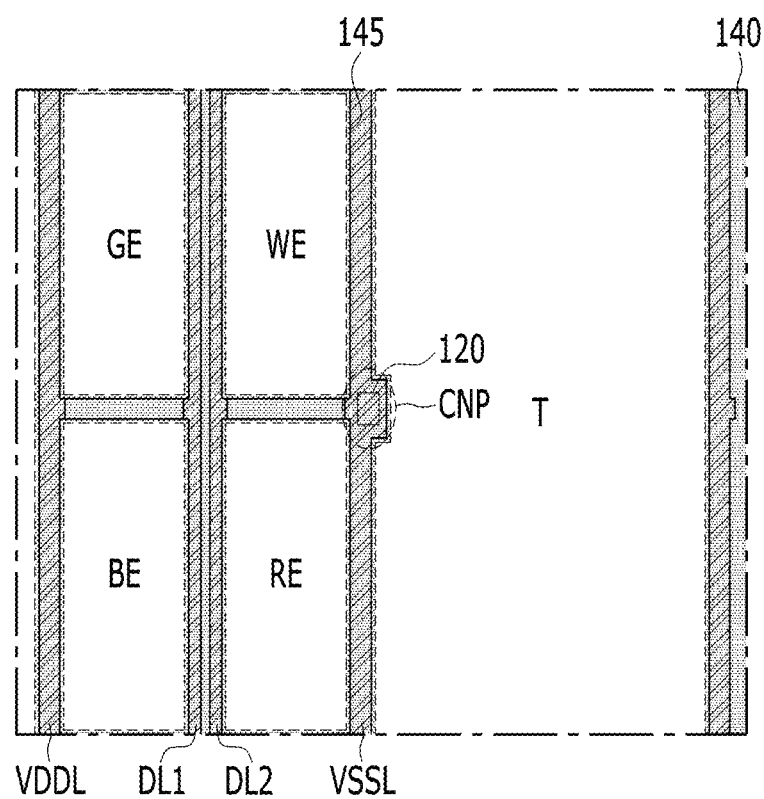
FIG. 1 is a plan view of a display device according to a first embodiment of the present invention.

In the drawings, the same or similar elements are denoted by the same reference numerals even though they are depicted in different drawings. In the following description, a detailed description of known functions and configurations incorporated herein will be omitted when it can make the subject matter of the disclosure rather unclear. In addition, names of components used in the following description are selected in consideration of ease in preparing the specification, and can be different from names of parts of an actual product.

In the drawings for explaining the exemplary embodiments of the present invention, for example, the illustrated shape, size, ratio, angle, and number are given by way of example, and thus, are not limitative of the disclosure of the present invention. Throughout the present specification, the same reference numerals designate the same constituent elements. In addition, in the following description of the present invention, a detailed description of known functions and configurations incorporated herein will be omitted when it can make the subject matter of the present invention rather unclear. The terms "comprises", "includes", and/or "has", used in this specification, do not preclude the presence or addition of other elements unless used along with the term "only." The singular forms are intended to include the plural forms as well, unless the context clearly indicates otherwise.

In the interpretation of constituent elements included in the various embodiments of the present invention, the constituent elements are interpreted as including an error range even if there is no explicit description thereof.

In the description of the various embodiments of the present invention, when describing positional relationships, for example, when the positional relationship between two parts is described using "on", "above", "below", "aside", or the like, one or more other parts can be located between the two parts unless the term "directly" or "closely" is used therewith.

In the description of the various embodiments of the present invention, although terms such as, for example, "first" and "second" can be used to describe various elements, these terms are merely used to distinguish the same or similar elements from each other and may not define order. Therefore, in the present specification, an element modified by "first" can be the same as an element modified by "second" within the technical scope of the present invention unless mentioned otherwise.

The respective features of the various embodiments of the present invention can be partially or wholly coupled to and combined with each other, and various technical linkages therebetween and operation methods thereof are possible. These various embodiments can be performed independently of each other, or can be performed in association with each other.

Hereinafter, a display device according to embodiments of the present invention will be described in detail with reference to the accompanying drawings.

Figure 2:
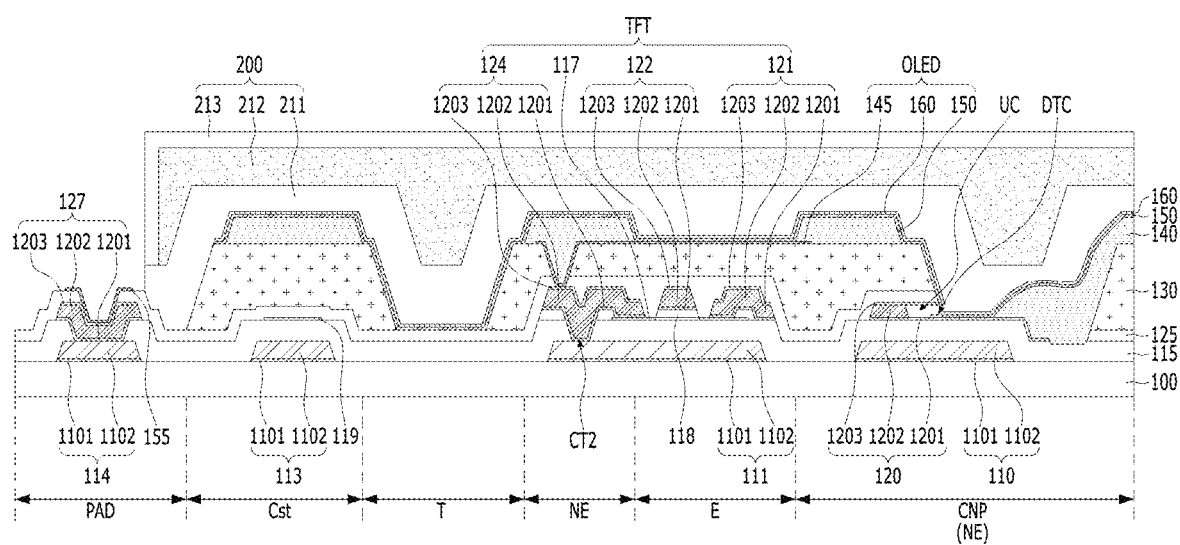
FIG. 2 is a sectional view of the display device according to the first embodiment of the present invention.

FIG. 1 is a plan view of a display device according to a first embodiment of the present invention, and FIG. 2 is a sectional view of the display device according to the first embodiment of the present invention. All the components of the display device according to all embodiments of the present invention are operatively coupled and configured.

As shown in FIGS. 1 and 2, the display device according to the first embodiment of the present invention includes a substrate 100 including a plurality of pixels, each of which having a plurality of emission portions GE, WE, BE, and RE and a transmissive portion T disposed so as to neighbor the plurality of emission portions; a light-emitting device provided at each emission portion; an auxiliary electrode 120 formed on a layer of a non-emission portion lower than a first electrode 145, the auxiliary electrode 120 including a first metal layer 1201 and a second metal layer 1202 stacked on the first metal layer, the second metal layer 1202 having a smaller area than the first metal layer 1201; a passivation film 125 disposed so as to protrude more than the second metal layer 1202, the passivation film 125 being configured to expose a part of the first metal layer 1201; and a gap portion UC disposed at the side of the second metal layer 1202 between the passivation film 125 and the first metal layer 1201.

The display device according to one or more examples of the present invention has a transmissive portion T having a predetermined area or more such that the construction of the rear surface of the substrate 100 is visible like glass. The transmissive portion T transmits light like a kind of transparent film. Each of the emission portions E (e.g., GE for green, WE for white, BE for blue, and RE for red) includes a light-emitting device OLED constituted as the result of stacking of a first electrode 145, an organic layer 150, and a second electrode 160.

A thin film transistor TFT is electrically connected to the first electrode 145 such that the thin film transistor TFT is turned on/off, whereby display is selectively possible. For example, the display device according to the present invention has the transmissive portion T and the emission portions GE, WE, BE, and RE, whereby light transmission and emissive display are simultaneously performed. Here, the emission portions GE, WE, BE, and RE are regions configured to emit green, white, blue, and red, respectively; however, other combinations of the emission portions are possible.

Each of the emission portions GE, WE, BE, and RE can be selectively provided with a color emissive layer, or a color filter layer can be provided on an encapsulation layer 200 or at an opposite substrate to realize color display. In the latter case, the light-emitting device OLED (e.g., organic light emitting diode) provided at each of the emission portions GE, WE, BE, and RE can commonly emit white, and no color filter layer can be provided for the white emission portion WE. When voltage is applied through the thin film transistor to each of the emission portions GE, WE, BE, and RE, each of the emission portions GE, WE, BE, and RE emits a color corresponding thereto, whereby an image is realized.

A bank 140 (e.g., see FIG. 2) can be provided at a region excluding the emission portions GE, WE, BE, and RE and the transmissive portion T shown in FIG. 1. Consequently, the bank 140 can overlap data lines DL (DL1 and DL2), a gate line, a power voltage line VDDL, and a ground voltage line VSSL.

The thin film transistor TFT includes a semiconductor layer 117, a gate electrode 122 formed above the semiconductor layer 117 via a gate dielectric film 118, the gate electrode overlapping a channel region of the semiconductor layer, and a source electrode 121 and a drain electrode 124 connected to both ends of the semiconductor layer 117.

In the display device according to the embodiment(s) of the present invention, the second electrode 160 is jointly formed as a single body at the transmissive portion T as well as the emission portions GE, WE, BE, and RE of the substrate 100 for light transmission through the transmissive portion T. In order to secure a predetermined level or more of transmittance of the transmissive portion T, even in the case in which the second electrode 160 is provided at the transmissive portion T, the second electrode 160 can be made of a transparent oxide, such as indium tin oxide (ITO), indium zinc oxide (IZO), indium tin zinc oxide (ITZO), or tin oxide (TO). At each of the emission portions GE, WE, BE, and RE, the first electrode 145 of the light-emitting device OLED is selectively formed for the emission portions GE, WE, BE, and RE.

In order to increase resonance in an emissive layer between the first electrode 145 and the second electrode 160 without light loss from the emission portions GE, WE, BE, and RE to the rear surface of the substrate 100 such that light exits to the upper side of the second electrode 160, the first electrode 145 is formed so as to include a reflective electrode. For example, the reflective electrode can be made of Ag, an Ag alloy, Al, an Al alloy, Cu, a Cu alloy, Cr, a Cr alloy, Mo, or a Mo alloy. However, it is preferred that the first electrode 145 should have low battery properties to smoothly inject holes from the first electrode 145 to the organic layer 150 of the light-emitting device OLED as well as reflection properties. Consequently, the metal abutting the organic layer 150 can include indium tin oxide (ITO), and the first electrode 145 can be formed so as to have a structure including a plurality of layers, such as a reflective electrode and ITO. For example, the first electrode 145 can be formed so as to have a dual stack structure of a reflective metal/ITO or a triple stack structure of ITO/a reflective metal/ITO.

Meanwhile, in a structure in which the transmissive portion T has a predetermined area and thus the size of each of the emission portions GE, WE, BE, and RE is small, as in the display device according to the present invention, the area of each of the emission portions GE, WE, BE, and RE is small and light loss may occur from the transmissive portion T adjacent thereto to the rear surface, and therefore high-luminance emission efficiency is needed. To this end, a reflective electrode having high reflectance, such as Ag or an Ag alloy (e.g. APC) can be used as the reflective metal included in the first electrode 145. The inventors of the present application have found through experimentation that, in defining the gap portion UC in the display device, when the first electrode 145 is provided so as to protrude from the gap portion using the first electrode as a dummy pattern, the reflective electrode, such as Ag or an Ag alloy, constituting the first electrode 145 has low resistance to heat, and a region thereof exposed through processing can be oxidized and thus deformed, whereby it may be difficult to protrude the dummy pattern of the first electrode 145 from the gap portion UC, and have changed the construction of the gap portion UC in consideration thereof. For example, some of the metal layers of the auxiliary electrode 120 on the same layer as the gate line or the data lines DL formed under the first electrode 145 are selectively patterned, and the gap portion UC is defined in the region of the selectively removed metal layers.

For the passivation film 125 formed on the gap portion UC, an undercut occurs at the lower side of the passivation film 125, since a part of the lower metal 1202 is removed.

In the example shown in FIG. 2, the auxiliary electrode 120 further includes a third metal layer 1203 formed on the second metal layer 1202 such that ends of corresponding regions of the passivation film 125 and the gap portion UC coincides with each other, in addition to the first and second metal layers 1201 and 1202. However, in the case in which the auxiliary electrode 120 mainly includes the first and second metal layers 1201 and 1202 having an area difference therebetween and further includes an additional metal layer on the second metal layer or under the first metal layer so as to have a two or more-layered structure, in addition to the three-layered structure shown, the auxiliary electrode can have the function of the gap portion UC. In a structure in which a plurality of metal layers and/or dielectric layers is stacked, the gap portion UC is formed so as to be introduced farther inwards. The first and second metal layers 1201 and 1202 having different areas have different etching rates.

For example, the gap portion UC is formed in a space in which the second metal layer 1202 having a smaller area than the first metal layer 1201 is removed, the organic layer 150, which is deposited while having straightness is not deposited in the gap portion UC, and at least a part of the second electrode 160, which has relatively high step coverage properties, is introduced into the gap portion UC, whereby the second electrode 160 is directly connected to the first metal layer 1201, and therefore first connection CT1 is formed. The gap portion UC can be provided at each subpixel provided in the substrate 100, or can be provided for a plurality of subpixels at intervals.

The effect of the first connection CT1 is that the second electrode 160 and the auxiliary electrode 120, which applies a VSS voltage signal, are connected to each other even in an active area AS, not the outer edge of the substrate 100, whereby VSS voltage applied to the second electrode is uniformly applied without any difference between regions.

The organic layer 150 formed at each of the emission portions GE, WE, BE, and RE can include an organic emissive layer and organic common layers disposed thereunder and thereon. Even though the organic layer 150 is formed without a mask, the organic layer 150 can be divided in a horizontal plane using the gap portion UC as the border, as shown in FIG. 2.

For example, as the organic common layers included in the organic layer 150, a hole injection layer and a hole transport layer can be provided under the organic emissive layer, and an electron transport layer and an electron injection layer can be further provided on the organic emissive layer. Thereamong, the organic emissive layer and the auxiliary hole transport layer, which compensates for color resonance, can be formed by dividing the same for each subpixel selectively using a fine metal mask (FMM) and specifying the emission portion or the emission portion and a margin region therearound. In the display device according to the present invention, even in the case in which at least some layers of the organic layer 150 are commonly formed at the subpixels without the fine metal mask (FMM), the layers of the organic layer 150 can be divided from each other at the region at which the gap portion UC is formed, whereby a problem of lateral current leakage occurring in the case in which the organic layer 150 is commonly provided at adjacent subpixels can also be solved.

In the light-emitting device, the first electrode 145 can function as an anode, and the second electrode 160 can function as a cathode. The first electrode 145 is divided for each subpixel, and is formed so as to partially overlap the bank 140 at each of the emission portions GE, WE, BE, and RE and a periphery thereof for each of the emission portions GE, WE, BE, and RE of FIG. 1. The first electrode 145 is independently connected to the thin film transistor TFT so as to receive a signal. The thin film transistor TFT can be connected to the gate line and the data lines DL (DL1 and DL2) so as to receive a signal.

Each subpixel includes a light-emitting device OLED, at least two thin film transistors electrically connected to the light-emitting device, and at least one storage capacitor. A driving thin film transistor TFT (see FIG. 2) connected to the first electrode 145 of the light-emitting device OLED can be connected to a power voltage line VDDL configured to apply power voltage VDD in parallel to the data lines DL, and the second electrode 160 can be connected to a ground voltage line VSSL configured to apply ground voltage VSS.

In the display device according to the present invention, the ground voltage line VSSL can be formed of, for example, a metal on the same layer as a light blocking layer 110 (see FIG. 2), or can be formed of a metal on the same layer as the gate line or the data lines. Depending on circumstances, the ground voltage line VSSL and the auxiliary electrode 120 can be integrated. In the case in which the auxiliary electrode 120 and the ground voltage line VSSL are integrated, the auxiliary electrode 120 and the ground voltage line VSSL are formed in the same process. In this case, the auxiliary electrode 120 can be formed on the same layer as the data lines DL and the power voltage line VDDL. In this case, in the display device according to the present invention, the second metal layer 1202 of the auxiliary electrode 120 is removed at the undercut region thereof, and there is no partial removal of the second metal layer 1202 for the power voltage line VDDL, whereby the plural-layered structure is maintained without any difference between the first and second metal layers 1201 and 1202.

The auxiliary electrode 120 includes the first metal layer 1201 and the second metal layer 1202 having a smaller area than the first metal layer 1201, and can further include the third metal layer 1203 formed on the second metal layer 1202 so as to have a larger area than the second metal layer 1202, the third metal layer being made of the same metal as the first metal layer 1201.

In the plan view of FIG. 1, the gate line extends overlapping the emission portions GE, WE, BE, and RE, and overlaps the first electrode 145, whereby the gate lines are omitted from the figure. The gate line can be provided in a direction intersecting the data lines DL for each pixel. However, the present invention is not limited thereto. In the region of the transmissive portion T, the gate line can detour and extend in the form of a first line in a direction perpendicular to the data lines DL, and can be electrically connected to a second line extending in a horizontal direction overlapping the light-emitting portions. Depending on circumstances, the gate line or the data lines can be provided on the same layer as the light blocking layer 111 of FIG. 2. In this case, the metal layer of the thin film transistor array provided on the substrate 100 can be configured to have a two-layered structure, whereby it is possible to reduce the number of masks.

Meanwhile, the first electrode can be formed so as to be larger than each of the emission portions GE, WE, BE, and RE.

The emission portions GE, WE, BE, and RE and the transmissive portion T can be defined as an open region of the bank 140. The bank 140 and the edge of the first electrode 145 can partially overlap each other, and the bank 140 can overlap wires including the data lines DL (DL1 and DL2), the power voltage line VDDL, and the ground voltage line VSSL.

Compared to the first electrode 145 divided for each subpixel, the second electrode 160 can be formed as one body over a plurality of subpixels provided in the active area of the substrate 100. In the case in which the area of the display device is increased, the size of the second electrode 160 is also increased. Since a driving unit is provided at the edge of the substrate, a signal is supplied to the edge of the substrate. When the area of the second electrode 160 is increased, VSS voltage applied to the second electrode can be lowered at the portion thereof distant from the driving unit. In the display device according to the present invention, however, the auxiliary electrode 120 is provided in the non-emission portion, and a direct connection portion DTV is provided between the auxiliary electrode 120 and the second electrode 160, whereby it is possible to prevent lowering in voltage that can occur at the second electrode 160.

At this time, in the organic layer 150 and the second electrode 160, which are sequentially formed, step coverage of the second electrode 160 including a metal material is higher than step coverage of the organic layer 150. In the display device according to the present invention, therefore, the gap portion UC is provided at the lower structure before the organic layer 150 is formed, a film such as the passivation film 125 is formed on the gap portion UC such that the organic layer 150, which is vertically deposited, is not formed in the gap portion UC, and the second electrode 160 is introduced into at least a part of the gap portion UC as well as the organic layer 150 so as to have direct connection DTC with the auxiliary electrode 120, whereby auxiliary connection is provided. The auxiliary electrode 120 and the region of the auxiliary electrode 120 at which the second electrode 160 is formed are referred to as an auxiliary connection portion CNP.

In the display device according to the present invention, the second electrode 160 is introduced into the gap portion UC from the non-emission portion so as to be connected to the first metal layer 1201 of the auxiliary electrode 120.

The vertical distance of the gap portion UC can be the thickness of the second metal layer 1202. One reason for this is that the gap portion UC is defined in the region from which the second metal layer 1202 is removed. When the auxiliary electrode 120 is constituted by two metal layers, the second metal layer 1202 is removed, and the passivation film 125 is formed thereon so as to have a region corresponding to the gap portion UC. When the auxiliary electrode 120 is constituted by three metal layers, as shown, the gap portion UC is defined in the region from which the second metal layer 1202 is removed from between the first and third metal layers 1201 and 1203.

In the display device according to the first embodiment of the present invention, in order to prevent the first electrode (anode) from being deformed in a bank formation process when the first electrode has a highly reflective metal such that emission portions driven in an upper emission structure have high-efficiency properties, the auxiliary electrode 120 having the gap portion is formed on the metal layer constituting the gate line or the data line thereunder irrespective of the material that forms the first electrode (anode), whereby it is possible to prevent the first electrode from protruding outwards in a tip-shaped structure.

Further, in the display device according to the first embodiment of the present invention, the second metal layer 1202 between the third metal layer 1203 and the first metal layer 1201 constituting the auxiliary electrode is removed from between the passivation film 125 and the auxiliary electrode, whereby the gap portion UC is defined. In this case, the upper metal layer remaining on the gap portion is made of a metal having high conductivity, such as aluminum (Al), chromium (Cr), copper (Cu), titanium (Ti), molybdenum (Mo), or tungsten (W), or an alloy including at least one of the metals, which is hardly deformed in a subsequent bank firing process. Consequently, the vertical gap of the gap portion is stably maintained even after the bank is formed, the organic layer 150, which is subsequently deposited while having straightness is prevented from being introduced into the gap portion UC, and the second electrode 160 is introduced into the gap portion UC, whereby the outside of the organic layer and the lower metal layer are directly connected to each other, and therefore electrical connection of the auxiliary electrode is stably performed. As a result, it is possible to increase the lifespan of the display and to prevent the occurrence of an afterimage.

In the display device according to the first embodiment of the present invention, the first electrode having high reflectance is used at each emission portion, whereby emission efficiency is improved, and therefore it is possible to increase the area of the transmissive portion to thus improve transmittance. At the same time, it is possible to prevent lowering in voltage of the second electrode 160, which is commonly used for the emission portions and the transmissive portion.

In addition, in the display device according to the first embodiment of the present invention, the gap portion UC is formed on the same layer as the gate line or data line metal layer, whereby it is possible to realize a voltage lowering prevention structure while not increasing the number of masks without addition of a separate wire or a separate inorganic film.

The auxiliary electrode 120 can be located on the same layer as at least one of the gate line and the data lines (DL). FIG. 2 shows an example of the auxiliary electrode 120 located on the same layer as the source electrode 121 and the drain electrode 124 of the thin film transistor as an example. The thin film transistor shown in FIG. 2 has a coplanar structure. The gate electrode 122 is also located on the same layer as the source and drain electrodes 121 and 124, and the gate dielectric film 118 is interposed between the gate electrode 122 and the semiconductor layer 117 for electrical insulation from the semiconductor layer 117 overlapping therewith.

The semiconductor layer 117 can be an oxide semiconductor layer or an amorphous or crystalline silicon layer. The region of the semiconductor layer 117 located outside the gate dielectric film 118 is doped with a dopant, whereby it is possible to reduce resistance at the time of electrical connection with the source electrode 121 and the drain electrode 124.

Light blocking layers 110, 111, 113, and 114 are formed on the substrate 100 so as to extend in one direction, and can be used for wiring of the data lines DL (DL1 and DL2), the power voltage line VDDL, the ground voltage line VSSL, or the gate line. Each of the light blocking layers 110, 111, 113, and 114 can be constituted by a single metal layer or can have a structure including two or more metal layers, as shown. Each of layers 1101 and 1102 constituting each of the light blocking layers 110, 111, 113, and 114 can be made of a metal having high conductivity, such as aluminum (Al), chromium (Cr), copper (Cu), titanium (Ti), molybdenum (Mo), or tungsten (W), or an alloy of the metals.

A buffer layer can be further informed between the light blocking layers 110, 111, 113, and 114 and the substrate 100 in order to prevent impurities from permeating from the substrate 100 to the upper part thereof at which the light blocking layers 110, 111, 113, and 114 are formed.

An interlayer dielectric film 115 can be further provided between the light blocking layers 110, 111, 113, and 114 and the auxiliary electrode 120, and the source electrode 121, the drain electrode 124, the gate electrode 122, and a first pad electrode 127 can be provided on the same layer as the auxiliary electrode 120. In the case in which each of the auxiliary electrode 120, the source electrode 121, the drain electrode 124, the gate electrode 122, and the first pad electrode 127 has a three-layered structure, as shown in FIG. 2, each layer can be made of a metal having high conductivity, such as aluminum (Al), chromium (Cr), copper (Cu), titanium (Ti), molybdenum (Mo), or tungsten (W), or an alloy of the metals. The second metal layer 1202 of the auxiliary electrode 120 is used as the gap portion UC. The first and second metal layers 1201 and 1202 are made of metals having different etching rates. The second metal layer 1202 can be a different metal or different metal alloy layer from the first metal layer 1201, and can be patterned so as to have a different area from the first metal layer 1201 in an etching process. The first metal layer 1201 and the third metal layer 1203 can be patterned in different processes using the second metal layer 1202 as the border, whereby the first metal layer 1201 and the third metal layer 1203 can be formed as the same metal or same metal alloy layers.

The gate dielectric film 118 is provided under the gate electrode 122 for electrical insulation from the semiconductor layer 117, and some of the gate dielectric film 118 can also remain under the source electrode 121 and the drain electrode 124 formed on the same layer as the gate electrode 122.

The passivation film 125 can be formed so as to overlay the gate electrode, the source electrode 121, the drain electrode 124, and the first pad electrode 127.

Meanwhile, the light blocking layer 113 and the semiconductor layer 119 doped with the dopant can be provided at the region of the storage capacitor Cst so as to be used as both electrodes of the storage capacitors. Depending on circumstances, the region of the storage capacitor Cst can be patterned so as to overlap the metal layer on the same layer as the source electrode 121, whereby capacitance of the storage capacitor Cst can be increased.

A pad unit PAD can constitute a pad electrode including a light blocking layer 114 extending from the data lines DL, the power voltage line, or the ground voltage line, a first pad electrode 127 connected thereto, and a second pad electrode 155 formed through the passivation film 125, the second pad electrode being disposed on the same layer as the first electrode 145. Any one of the three layers 114, 127, and 155 of the pad electrode can be omitted.

An overcoat layer 130 for planarization can be formed on the passivation film 125, and the bank, which exposes the emission portions GE, WE, BE, and RE and the transmissive portion T, is formed on the overcoat layer 130.

The overcoat layer 130 can be formed in the same process as the passivation film 125 using a half-tone mask. However, the overcoat layer 130 is removed from the transmissive portion T in order to improve transparency of the transmissive portion T, and the second pad electrode 155 of the pad unit PAD is exposed outside such that the second pad electrode 155 can be used for connection with an external circuit film. The overcoat layer 130 can be made of a transparent organic material so as to have a thickness of 1 µm or more capable of performing surface planarization. Each of the passivation film 125, the interlayer dielectric film 115, and the buffer layer is made of an inorganic dielectric film, such as a silicon nitride film, a silicon oxide film, or a silicon oxynitride film.

The passivation film 125 is formed overlapping the gap portion UC, and a part of the first metal layer 1201 exposed from the side of the gap portion UC can overlap the bank 140. In the display device according to the present invention, overlap between the first metal layer 1201 and the bank 140 is not essential. In order to prevent excessive direct contact with the organic layer 150 on the first metal layer 1201 of the auxiliary electrode 120, however, the portion of the exposed first metal layer 1201 can be hidden by the bank 140. The organic layer 150 can include a hole injection layer, a hole transport layer, an emissive layer, an electron transport layer, and an electron injection layer, which, however, are deposited so as to have low density through vacuum evaporation. Some or all thereof can be entirely deposited in the active area without an FMM mask for division between subpixels. When an organic material is deposited through vacuum evaporation, however, it is possible to prevent the organic layer 150 from being deposited in the gap portion UC due to high straightness thereof, and the second electrode 160 including the metal that is subsequently deposited can be introduced into the gap portion UC so as to have direct connection DTC with the first metal layer 1201 of the auxiliary electrode 120, since the second electrode 160 has high step coverage.

The organic layer 150 is formed so as to have a smaller thickness than metal layers, such as wires, the dielectric films 115 and 125, the overcoat layer 130, or the bank 140. The total thickness of the organic layer 150 is less than the thickness of the second metal layer 1202 constituting the gap portion UC. Even though some residuals are introduced into the gap portion UC when the organic layer 150 is deposited through vacuum evaporation, therefore, the second electrode 160, which is subsequently formed, sufficiently covers the residuals and has direct connection DTC with the first metal layer 1201 in the gap portion UC.

In this case, even though the organic layer 150 and the second electrode 160 are provided in the transmissive portion T, the second electrode 160 is a transparent electrode, and the organic layer 150 functions as a transparent layer since there is no lower electrode construction to which voltage is applied.

Meanwhile, an encapsulation layer structure 200 is formed so as to protect regions on the substrate 100 excluding the pad unit PAD. The encapsulation layer structure 200 is a structure in which inorganic encapsulation layers 211 and 213 and an organic encapsulation layer 212 are alternately disposed. The inorganic encapsulation layers 211 and 213 extend farther outwards than the organic encapsulation layer 212, whereby the inorganic encapsulation layers 211 and 213 are exposed outside to protect the organic encapsulation layer 212, which has relatively low resistance to moisture. The inorganic encapsulation layers 211 and 213 can prevent permeation of external moisture or external air, and the organic encapsulation layer 212 can prevent movement of particles in the display device and can prevent the particles from affecting the encapsulation layer structure 200.

In the encapsulation layer structure 200, the organic encapsulation layer 212 is thicker than inorganic encapsulation layers 211 and 213, and planarization thereof is possible. The first inorganic encapsulation layer 211, which is formed first on an array having a step on the substrate 100, is formed in consideration of a lower step. For example, the first inorganic encapsulation layer 211 can have a low surface in the transmissive portion T due to a step of the transmissive portion T, which is lower than peripherals thereof, and can have a low surface in a hole in the bank 140 formed on the exposed first metal layer 1201 of the auxiliary electrode 120 and in a hole in the overcoat layer 130.

Depending on circumstances, a color filter layer or a touch electrode array can be further provided on the encapsulation layer structure 200.

Hereinafter, the construction of the auxiliary connection portion CNP will be described in more detail.

The auxiliary connection portion CNP is also applicable to an upper emission type display device that has only emission portions without a transmissive portion and that has a large-area second electrode, in addition to the display device having both the emission portions and the transmissive portion.

Figure 3:
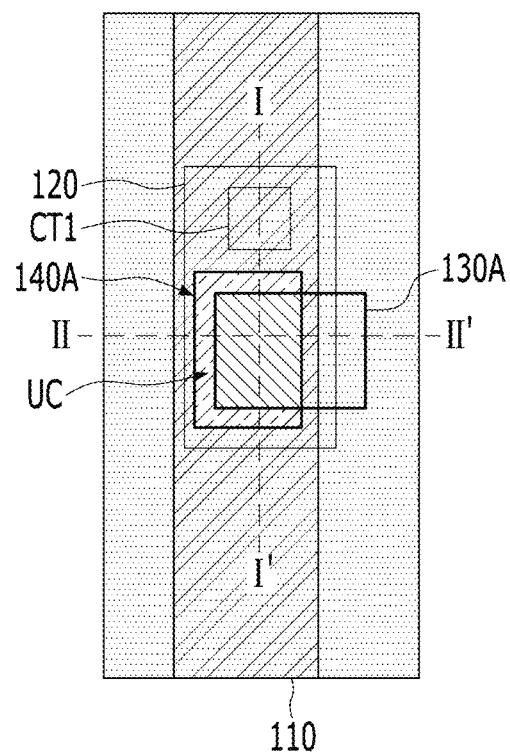
FIG. 3 is a plan view of a display device according to a second embodiment of the present invention.
Figure 4:
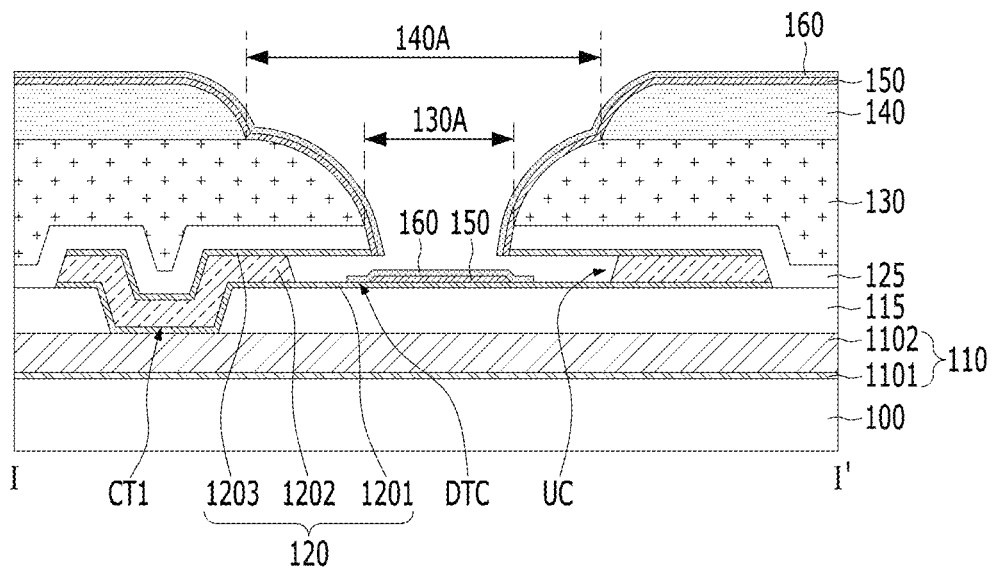
FIG. 4 is a sectional view taken along line I-I' of FIG. 3.
Figure 5:
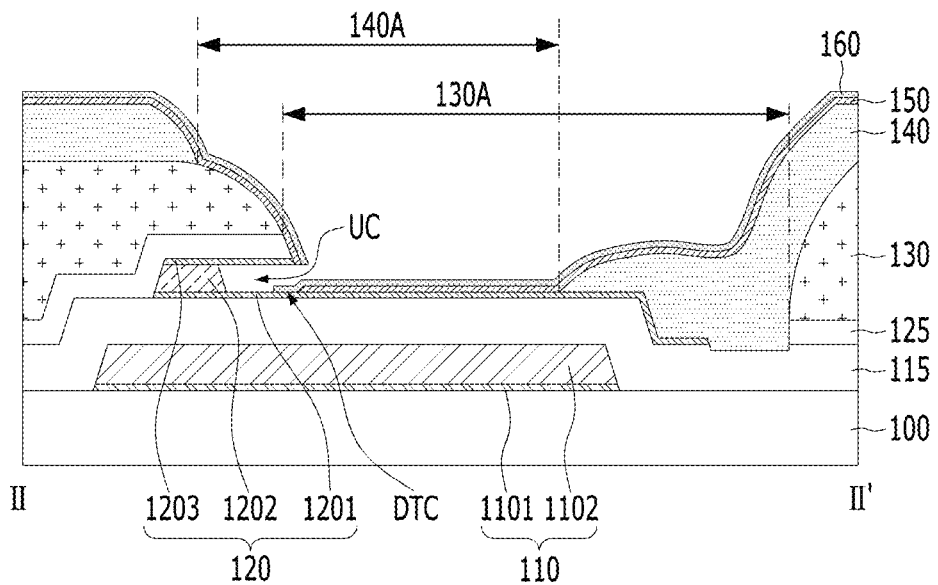
FIG. 5 is a sectional view taken along line II-II' of FIG. 3.

FIG. 3 is a plan view of a display device according to a second embodiment of the present invention, FIG. 4 is a sectional view taken along line I-I' of FIG. 3, and FIG. 5 is a sectional view taken along line II-II' of FIG. 3.

As shown in FIGS. 3 to 5, the display device according to the second embodiment of the present invention has an auxiliary connection portion CNP provided at a part of a non-emission portion. The auxiliary connection portion CNP has a light blocking layer 110 having a function of transmitting ground voltage VSS and first connection CT1 with the light blocking layer 110. The auxiliary connection portion CNP includes a plurality of layers, and a second layer 1202 thereof is removed so as to be introduced inwards more than a passivation film 125 located thereon, whereby a gap portion UC is formed.

An auxiliary electrode 120 includes a first metal layer 1201 and a second metal layer 1202 having a smaller area than the first metal layer 1201, and can further include a third metal layer 1203 formed on the second metal layer 1202 so as to have a larger area than the second metal layer 1202, the third metal layer being made of the same metal as the first metal layer 1201, as shown.

In the auxiliary connection portion CNP, an overcoat layer 130 formed on the passivation film 125 can be removed so as to have a first hole 130A identical to the passivation film 125. In the auxiliary connection portion CNP, a second hole 140A of a bank 140 at least has an overlap portion with the first hole 130A of the overcoat layer 130, whereby the region at which the side of the gap portion UC is entirely removed from the passivation film 125, the overcoat layer 130, and the bank 140 is provided, and an organic layer 150 and a second electrode 160 are sequentially deposited on the region of the first metal layer 1201 exposed through the region at which the first and second holes 130A and 140A overlap each other. At this time, the second electrode 160 can overlay and cover the organic layer 150 to the gap portion UC on the first metal layer 1201 since the second electrode 160 has higher step coverage than the organic layer 150, and the second electrode 160 is introduced, whereby the first metal layer 1201 and the second electrode 160 have direct connection therebetween.

The passivation film 125 protrudes more than the second metal layer 1202, and the third metal layer 1203 overlaps the gap portion UC, in the same manner as in the passivation film 125. The second metal layer 1202 is etched so as to be distinguished from the first and third metal layers 1201 and 1203, and is made of a different metal from the first and third metal layers 1201 and 1203. Here, the passivation film 125 is an inorganic dielectric film that overlays data lines and a thin film transistor including a source electrode and a drain electrode to primarily protect the same.

The first to third metal layers 1201, 1202, and 1203 constituting the auxiliary electrode 120 located under the passivation film 125 are layers that are formed of a metal on the same layer as one electrode 122, 121, or 124 of the thin film transistor, a gate line, or the data lines before a light-emitting device OLED (see FIG. 2) is formed. In the display device according to the present invention, the auxiliary electrode 120 is located under the layer of a first electrode 145 (see FIGS. 1 and 2) of the light-emitting device OLED, and wires and electrodes 122, 121, and 124 of the layer including the auxiliary electrode 120 can be defined irrespective of the shape of the first electrode 145.

Each of the first and third metal layers 1201 and 1203 constituting the auxiliary electrode 120 can be made of, for example, MoTi, and the second metal layer 1202 can be made of copper (Cu). In this case, line resistance can be reduced, since copper (Cu), which exhibits high conductivity, is used as the second metal layer 1202. Since each of the third metal layer 1203 and the first metal layer 1201 on and under the second metal layer 1202 is made of a MoTi alloy, it is possible to prevent hydrogen contained in an interlayer dielectric film 115 and the passivation film 125 on a substrate 100 from affecting a semiconductor layer 117.

A first layer 1101 and a second layer 1102 of the light blocking layer 110 can be formed of MoTi and Cu, respectively, whereby it is possible to prevent impurities, such as hydrogen, from affecting the components on the substrate 100 and at the same time to secure high conductivity.

The thin film transistor TFT covered by the passivation film 125 can include a semiconductor layer 117, a gate electrode 122 formed above the semiconductor layer 117 via a gate dielectric film 118, the gate electrode overlapping a channel region of the semiconductor layer, and a source electrode 121 and a drain electrode 124 connected to both ends of the semiconductor layer 117.

In the auxiliary electrode 120 having the first connection CT1 extending through the auxiliary electrode 120 and the interlayer dielectric film 115, the gap portion UC is defined by removing the second metal layer 1202, among the plurality of layers, and the second metal layer 1202 is removed at the outside of the remaining second metal layer 1202, whereby the first metal layer 1201 is exposed. Each of the auxiliary electrode 120, the data lines DL, the source electrode 121, the gate electrode 122, and the drain electrode 124 has the same layer structure, whereby first and second metal layers 1201 and 1202 are essentially included. As shown, each of the auxiliary electrode 120, the data lines DL, the source electrode 121, the gate electrode 122, and the drain electrode 124 has a three-layered structure, whereby a third metal layer 1203 can be further provided on the second metal layer 1202.

When the third metal layer 1203 is provided so as to correspond to the auxiliary connection portion CNP, the third metal layer 1203 can be etched using the same mask as the passivation film 125, and each of the passivation film 125 and the third metal layer 1203 has one end overlapping the gap portion UC.

In a structure in which a transmissive portion T has a predetermined area and thus the size of each of emission portions GE, WE, BE, and RE is small, as in the display device according to the present invention, the area of each of the emission portions GE, WE, BE, and RE is small and light loss can occur from the transmissive portion T adjacent thereto to the rear surface, and therefore high-luminance emission efficiency is required. To this end, a reflective electrode having high reflectance, such as Ag or an Ag alloy (e.g. APC) can be used as a reflective metal included in the first electrode 145. The inventors of the present application have found through experimentation that, in defining the gap portion UC in the display device, when the first electrode 145 is provided so as to protrude from the gap portion using the first electrode as a dummy pattern, the reflective electrode, such as Ag or an Ag alloy, constituting the first electrode 145 has low resistance to heat, and a region thereof exposed through processing can be oxidized and thus deformed, whereby it is difficult to protrude the dummy pattern of the first electrode 145 from the gap portion UC, and have changed the construction of the gap portion UC in consideration thereof. For example, some of the metal layers of the auxiliary electrode 120 on the same layer as the gate line or the data lines DL formed under the first electrode 145 are selectively patterned, and the gap portion UC is defined in the region of the selectively removed metal layers.

The vertical distance of the gap portion UC can be the thickness of the second metal layer 1202, and the gap portion UC is defined in the space between the passivation film 125 or the third metal layer 1203 and the first metal layer 1201 from which the second metal layer 1202 is removed. In this case, the third metal layer 1203 remaining thereon is made of a metal having high conductivity, such as aluminum (Al), chromium (Cr), copper (Cu), titanium (Ti), molybdenum (Mo), or tungsten (W), or an alloy including at least one of the metals, which is hardly deformed in a subsequent bank firing process.

Consequently, the vertical gap of the gap portion UC is stably maintained even after the bank is formed, the organic layer 150, which is subsequently deposited while having straightness is prevented from being introduced into the gap portion UC, and the second electrode 160 is introduced into the gap portion UC, whereby the outside of the organic layer 150 and the first metal layer 1201 are directly connected to each other, and therefore electrical connection of the auxiliary electrode 120 is performed. At this time, ground voltage is applied to the second electrode 160 through the light blocking layer 110, which applies ground voltage in the auxiliary connection portion CNP, and the auxiliary electrode 120, which has the first connection CT1 with the light blocking layer 110.

An overcoat layer 130 for planarization can be formed on the passivation film 125, a contact hole configured to connect the drain electrode 124 of the thin film transistor and the first electrode 145 to each other is formed through the overcoat layer 130 and the passivation film 125, and third connection CT3 can be provided through the contact hole. When the contact hole is formed through the overcoat layer 130 and the passivation film 125, the overcoat layer 130 and the passivation film 125 are patterned, whereby the first hole 130A can be formed.

The first electrode 145 is formed on the overcoat layer 130 excluding the region of the third connection CT3 corresponding to the contact hole. The first electrode 145 of the display device according to the present invention includes a highly-reflective electrode, such as Ag or an Ag alloy, in order to improve emission efficiency based on the area of the emission portions reduced by the provision of the transmissive portion. However, the present invention is not limited thereto, and a highly-reflective metal equivalent to Ag or an Ag alloy can be used in addition to Ag or the Ag alloy. Although the highly-reflective metal can be formed so as to have a single layer, the upper layer directly contacting the organic layer 150 can include a transparent metal capable of lowering a barrier at the interface contacting the organic layer 150, such as ITO.

In defining the emission portions and the transmissive portion, the bank 140 also defines the second hole 140A in the non-emission portion. Each of the bank 140 and the overcoat layer 130 can be formed of an organic dielectric film, such as polyimide, polyacrylic, or benzocyclobutene (BCB). Depending on circumstances, the bank 140 can include carbon black in order to block light at the region at which the bank 140 is formed.

The gap portion UC can be provided in the region between the passivation film 125 adjacent to the first hole 130A and the first metal layer 1201 from which the second metal layer is removed. The auxiliary electrode 120 is provided on the light blocking layer 110 so as to overlap therewith, and electrical connection is achieved through first connection CT1 therebetween.

In the display device according to the present invention, the second electrode 160 is jointly formed as a single body at the emission portions GE, WE, BE, and RE and the transmissive portion T. In order to secure a predetermined level or more of transmittance of the transmissive portion T even in the case in which the second electrode 160 is provided at the transmissive portion T, the second electrode 160 can be made of a transparent oxide, such as indium tin oxide (ITO), indium zinc oxide (IZO), indium tin zinc oxide (ITZO), or tin oxide (TO). At each of the emission portions GE, WE, BE, and RE, the first electrode 145 of the light-emitting device OLED is selectively formed for the emission portions GE, WE, BE, and RE. In order to increase resonance in an emissive layer between the first electrode 145 and the second electrode 160 without light loss from the emission portions GE, WE, BE, and RE to the rear surface of the substrate 100 such that light exits to the upper side of the second electrode 160, the first electrode 145 is formed so as to include a reflective electrode. In a structure in which the transmissive portion T has a predetermined area and thus the size of each of the emission portions GE, WE, BE, and RE is small, as in the display device according to the present invention, the area of each of the emission portions GE, WE, BE, and RE is small and light loss can occur from the transmissive portion T adjacent thereto to the rear surface, and therefore high-luminance emission efficiency is required. To this end, a reflective electrode having high reflectance, such as Ag or an Ag alloy (e.g. APC) can be used as the reflective metal included in the first electrode 145. The inventors of the present application have found through experimentation that, in defining the gap portion UC in the display device, when the first electrode 145 is provided so as to protrude from the gap portion using the first electrode as a dummy pattern, the reflective electrode, such as Ag or an Ag alloy, constituting the first electrode 145 has low resistance to heat, and a region thereof exposed through processing can be oxidized and thus deformed, whereby it is difficult to protrude the dummy pattern of the first electrode 145 from the gap portion UC, and have changed the construction of the gap portion UC so as to be provided between the passivation film 125 and the auxiliary electrode 120 in consideration thereof. For example, some of the metal layers of the auxiliary electrode 120 on the same layer as the gate line or the data lines DL formed under the first electrode 145 are selectively patterned, and the gap portion UC is defined in the region of the selectively removed metal layers.

Meanwhile, the auxiliary electrode 120 of the present invention has a structure including a plurality of layers. Even in the case in which the gap portion is provided, therefore, the first metal layer 1201 can remain, and the auxiliary electrode can be transmitted to the side of the gap portion UC. In addition, each of the first metal layer 1201 and the third metal layer 1203 is formed of an alloy including titanium (Ti) having hydrogen blocking properties so as to form an electrode of the thin film transistor of the same layer as the auxiliary electrode 120, whereby it is possible to prevent hydrogen from affecting the thin film transistor.

In the bank 140, an overlap region identical to the first hole 130A of the overcoat layer 130 is secured at the auxiliary connection portion CNP in one direction, as shown in FIG. 4, and the second hole 140A is provided at the side thereof different from the gap portion UC so as to be located farther inwards e than the first hole 130A in other direction, as shown in FIG. 5. Consequently, it is possible to secure a region at which the organic layer 150 and the second electrode 160 are gently deposited along the side of the first hole 130A and the second hole 140A.

Meanwhile, in the following experimental examples, an example in which, when the first electrode, i.e. the anode, is formed, the gap portion is formed through a difference in etching rate from the lower layer using a dummy pattern thereof will be described.

Figure 6A:
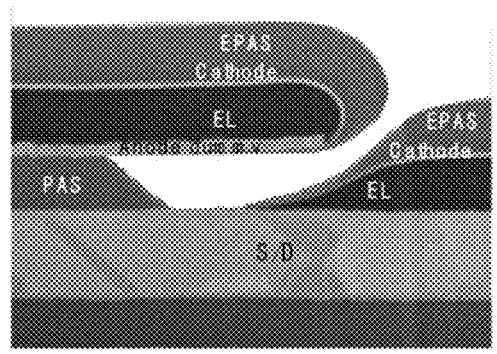
FIGS. 6A and 6B are SEM (scanning electron microscope) views showing first and second experimental examples of an undercut anode.
Figure 6B:
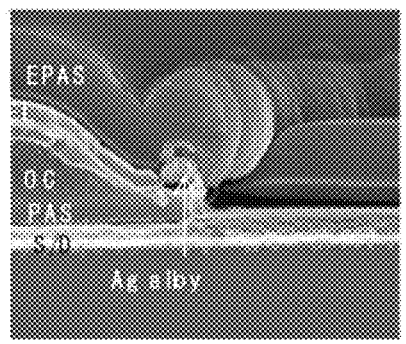

FIGS. 6A and 6B are SEM views showing first and second experimental examples of an undercut anode.

In the first experimental example, as shown in FIG. 6A, an auxiliary wire S/D is formed of a metal S/E of the same layer as a source/drain electrode, a passivation film PAS that overlays the auxiliary wire S/D is formed so as to expose a part of the auxiliary wire S/D, an anode dummy pattern of the same layer as an anode is formed so as to protrude more than the passivation film PAS, and an undercut is provided under the anode dummy pattern. In the first experimental example, each of the anode pattern and the anode dummy pattern is formed so as to have a triple film structure of ITO/Mo/ITO. In this case, an organic layer EL and a cathode are sequentially formed on the anode dummy pattern, and the cathode, which has relatively high step coverage, is introduced into the undercut more than the organic layer EL so as to be connected to the auxiliary wire S/D. A construction formed on the cathode is an inorganic encapsulation film EPAS having a kind of encapsulation function, which is located in the undercut more than the cathode to protect the construction of a light-emitting device including the organic layer EL and the cathode.

In the first experimental example, the anode dummy pattern includes molybdenum, degeneration of which is low in a firing process, whereby the anode dummy pattern is little changed before and after the cathode is formed.

However, in the case in which the anode dummy pattern includes Ag, which exhibits high reflection properties, for example, ITO/Ag alloy/ITO, as in the second experimental example, as shown in FIG. 6B, Ag, which is a highly reflective metal, of the anode dummy pattern located on the undercut structure so as to protrude swells as the result of being oxidized, whereby Ag forms lumps, and the organic layer EL and the cathode, which are subsequently formed, are deformed, whereby poor connection between the auxiliary wire S/D and the cathode is caused.

However, in the case in which the undercut region is defined using the dummy pattern of the first electrode (anode) including the highly reflective metal under the situation in which, in the display device including the transmissive portion, the area of the emission portions is reduced by the provision of the transmissive portion, whereby high efficiency of each emission portion is required and thus the use of a highly reflective metal is essential, defects shown in FIG. 6B can occur. Therefore, the inventors of the present application formed the region of the undercut (the gap portion) in a metal layer other than the first electrode.

In the display device according to the present invention, therefore, the auxiliary electrode is formed on a layer different from the first electrode made of Ag or an Ag alloy, particularly on the same layer as the wire thereunder, and transparent display is possible through the undercut structure between the auxiliary electrode and the passivation film formed thereon, high efficiency of the emission portions is maintained and at the same time lowering in voltage of the second electrode is prevented.

Meanwhile, in the display device according to the present invention, the xy dimension width of the gap portion UC is 5000 Å or more, whereby division of the organic layer 150 is performed in the gap portion UC and around the gap portion UC. Referring to FIG. 3, the gap portion UC is provided in the second hole 140A so as to have a "[" shape while wrapping the outside of the first hole 130A. In an I-I' direction, the xy dimension width of the gap portion UC can be defined as a vertical direction. In an II-II' direction, the xy dimension width of the gap portion UC can be defined as a vertical direction. In addition, the gap portion UC is defined as the result of the second metal layer 1202 being removed. The thickness of the second metal layer 1202 is about 4000 Å to 7000 Å, and the gap portion UC is formed so as to correspond to this thickness. The vertical distance of the gap portion UC is greater than the total thickness of the organic layer 150 in order to prevent connection with the organic layer 150 deposited on the side of the passivation film 125 even when some of the ingredients of the organic layer 150 are introduced into the gap portion UC.

Hereinafter, a method of manufacturing a display device according to an embodiment of the present invention will be described.

FIGS. 7A to 7F are process sectional views of the display device according to the second embodiment of the present invention taken along line I-I' of FIG. 3, and FIGS. 8A to 8F are process sectional views of the display device according to the second embodiment of the present invention taken along line II-II' of FIG. 3.

Figure 7A:
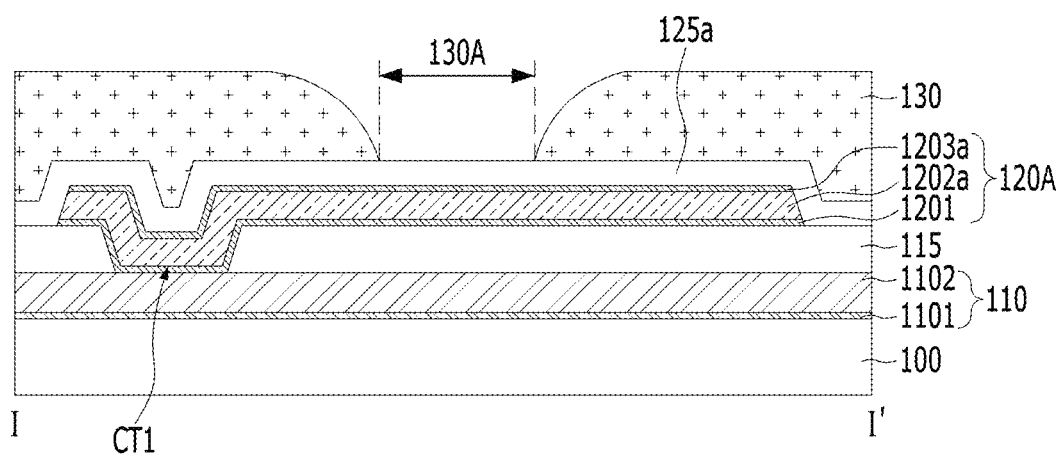
FIGS. 7A to 7F are process sectional views of the display device according to the second embodiment of the present invention taken along line I-I' of FIG. 3.
Figure 8A:
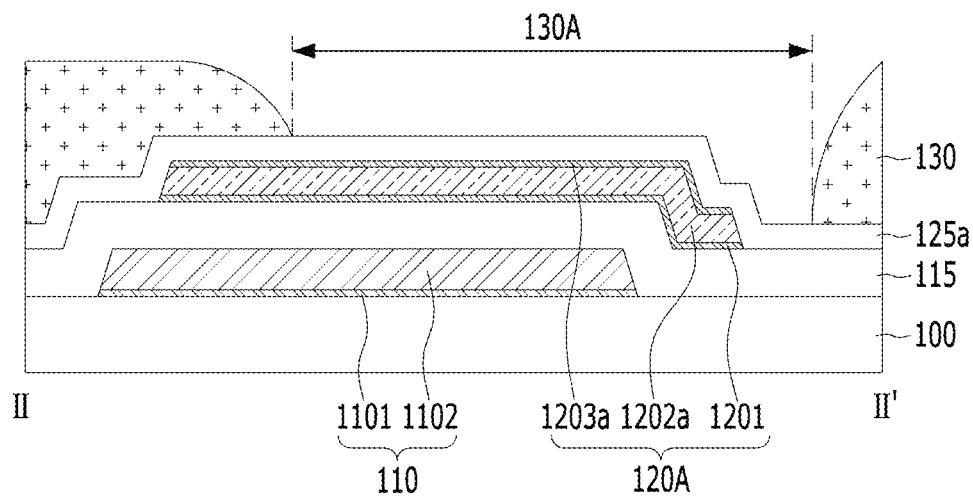
FIGS. 8A to 8F are process sectional views of the display device according to the second embodiment of the present invention taken along line II-II' of FIG. 3.

As shown in FIGS. 7A and 8A, a light blocking layer 110, in which a first layer 1101 and a second layer 1102 are stacked, is formed on a substrate 100. A buffer layer can be further provided between the light blocking layer 110 and the substrate 100.

The light blocking layer 110 is a layer to which ground voltage VSS is applied. A pad unit PAD extends and the pad unit PAD is directly connected to a circuit film, whereby the ground voltage VSS can be applied to the light blocking layer 110. Alternatively, the light blocking layer 110 can be directly connected to the pad unit PAD via a link wire provided on a different layer. The light blocking layer 110 can be located on the same layer as one of a gate line and data lines.

Subsequently, an interlayer dielectric film 115 is deposited on the light blocking layer 110.

As shown in FIG. 2, semiconductor layers 117 and 119 can be formed on the interlayer dielectric film 115 in a thin film transistor (TFT) formation region and a storage capacitor region.

A gate dielectric film 118 is formed on a part of the semiconductor layer 119.

The interlayer dielectric film 115 can form a contact hole, from which a part of each of the light blocking layers 110 and 111 is exposed, corresponding to first connection CT1 and second connection CT2.

Subsequently, an auxiliary electrode 120A overlapping the light blocking layer 110 and having the first connection CT1 through the contact hole of the interlayer dielectric film 115 is formed in a predetermined region of a non-emission portion. The auxiliary electrode 120A is formed by sequentially stacking a first metal layer 1201, a second metal layer 1202a, and a third metal layer 1203a and simultaneously patterning the first metal layer, the second metal layer, and the third metal layer so as to have the same width. In this process, as shown in FIG. 2, a gate electrode 121, a source electrode 122, and a drain electrode 124, each of which has a stack of first to third metal layers 1201, 1202, and 1203, can be formed. For example, the second metal layer 1202a can be made of Cu, and each of the first and third metal layers 1201 and 1203a can be made of MoTi. However, the present invention is not limited thereto. Other metals or metal alloys having a predetermined level or more of conductivity can be alternatively used as long as the first metal layer 1201 and the second metal layer 1202a are different from each other.

Subsequently, a passivation film/layer 125a is formed on the auxiliary electrode 120A.

Subsequently, an overcoat layer 130 for surface planarization is formed on the passivation film/layer 125a, and the overcoat layer 130 is selectively removed to form a first hole 130A corresponding to a part of the auxiliary electrode 120A.

Figure 7B:
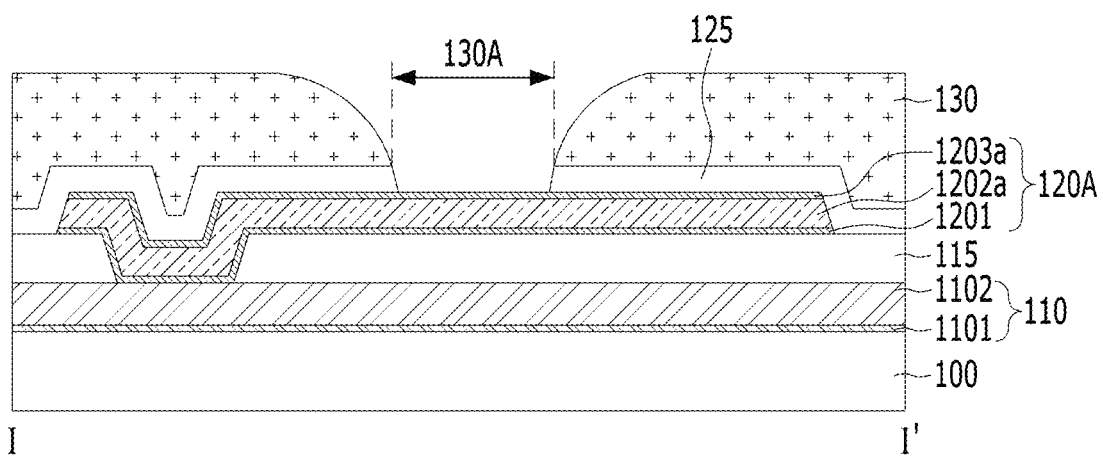
Figure 8B:
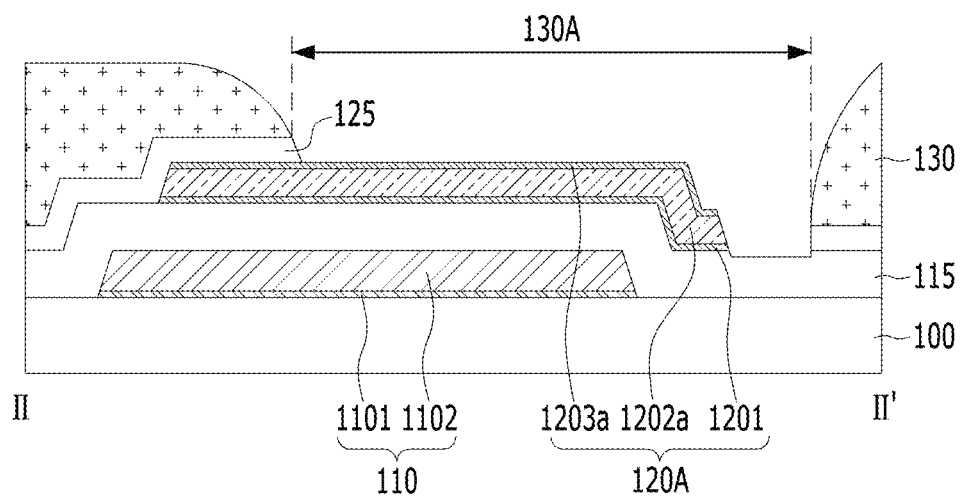

Referring to FIGS. 7B and 8B, a portion of the passivation film/layer 125a formed thereunder is removed using the first hole 130A, and the passivation film/layer 125a is patterned to expose the auxiliary electrode 120A corresponding to the first hole 130A. This forms a (patterned) passivation film 125. Here, a part of the thickness of the interlayer dielectric film 115 located outside the auxiliary electrode 120A exposed from the first hole 130A can be removed, as shown in FIG. 8B.

Figure 7C:
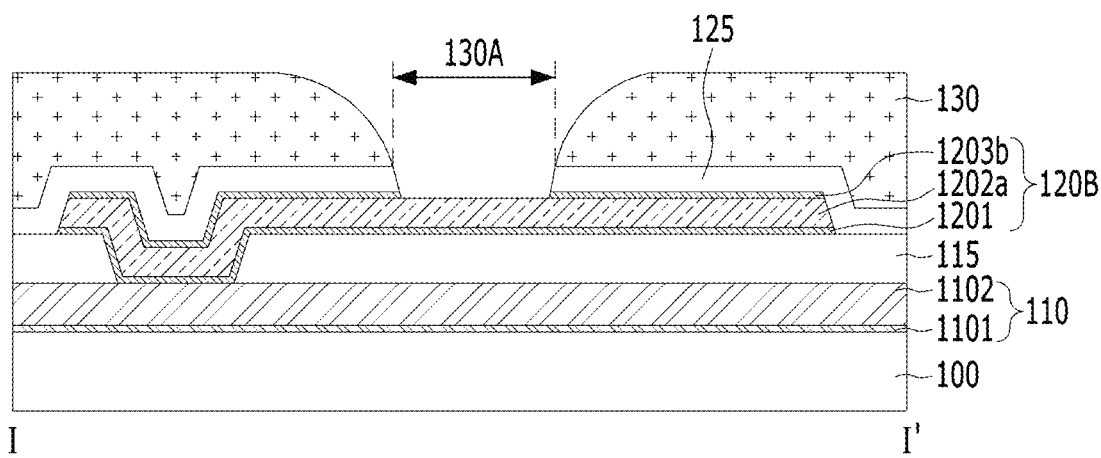
Figure 8C:
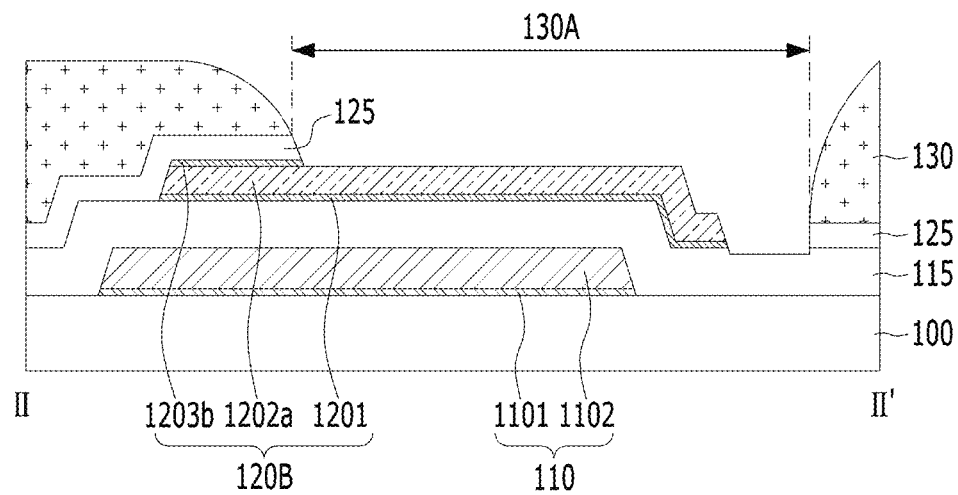

As shown in FIGS. 7C and 8C, a third metal layer 1203b of the auxiliary electrode 120A, located under the removed portion of the passivation film 125, exposed through the first hole 130A, can be removed.

Figure 7D:
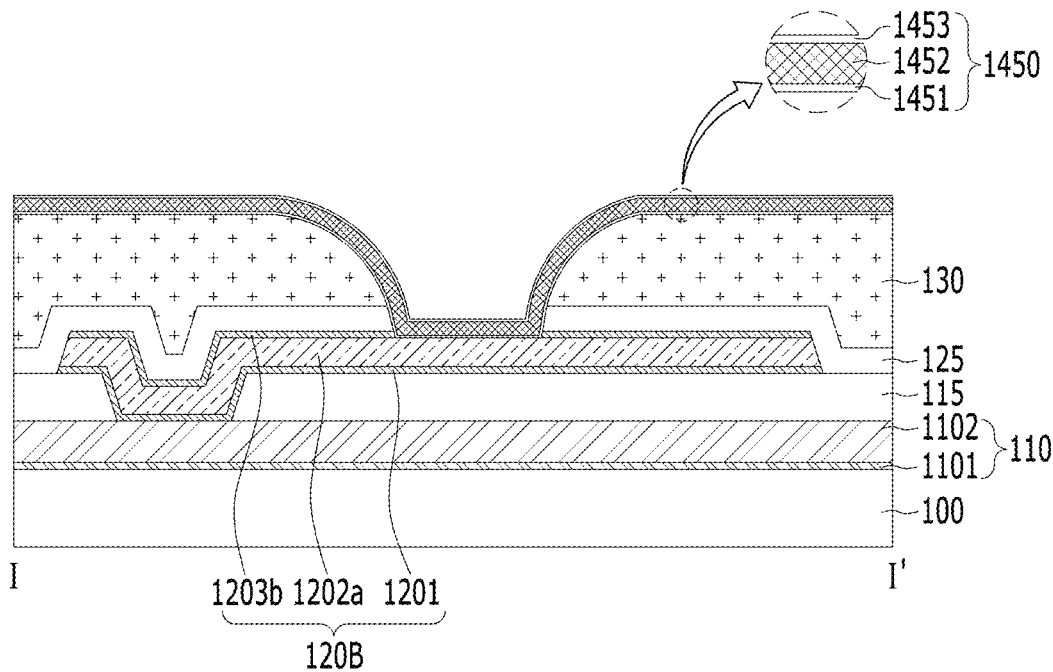
Figure 7E:
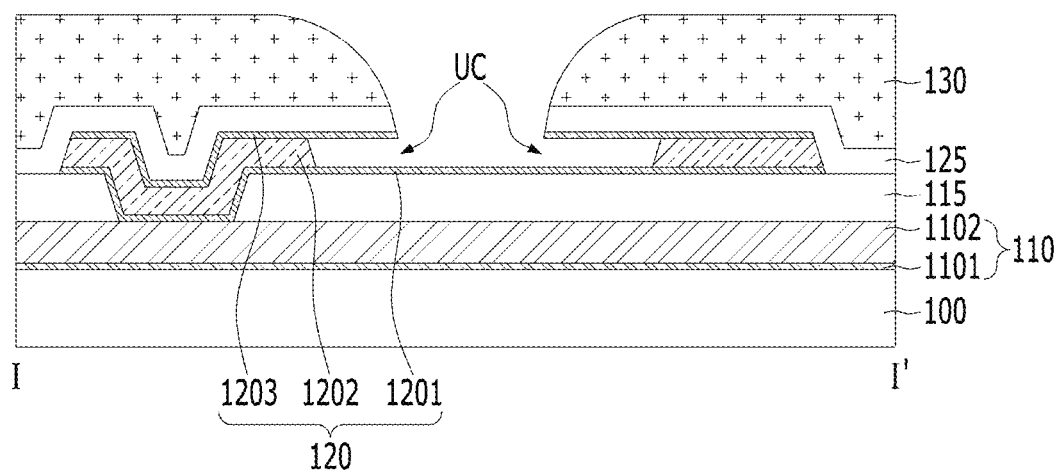
Figure 8D:
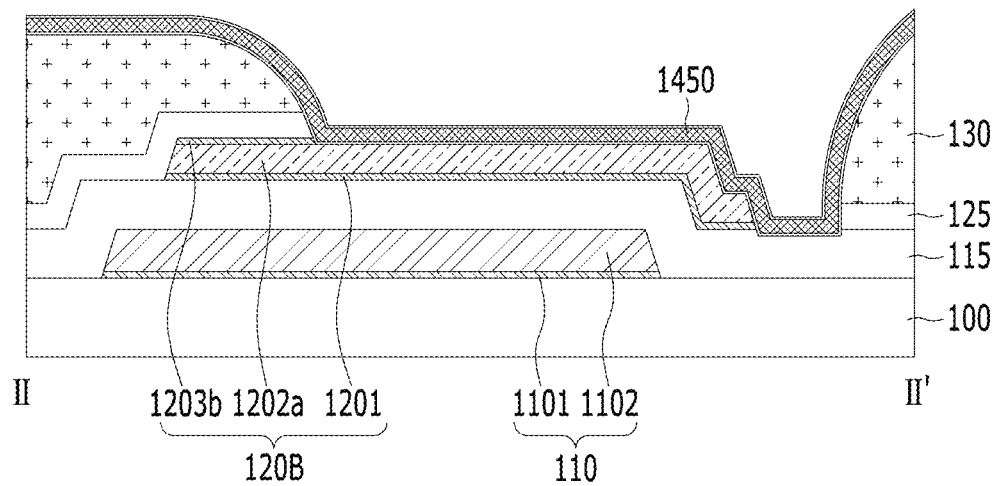
Figure 8E:
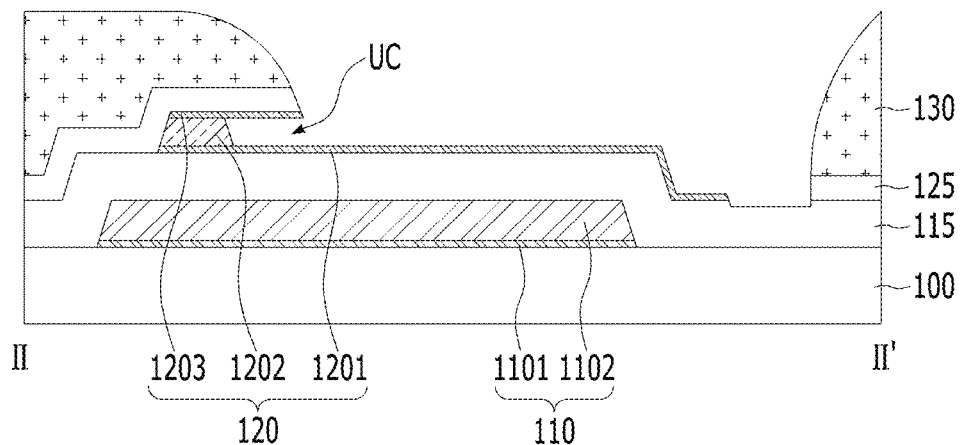

As shown in FIGS. 7D and 8D, a first electrode metal layer 1450 is formed on the overcoat layer 130 including the first hole 130A, and is selectively removed to form a first electrode 145 in an emission portion E, as shown in FIG. 2. As shown in FIG. 7D, the first electrode metal layer 1450 can include two or more layers 1451, 1452, and 1453. Thereamong, the layer 1452, which constitutes the main thickness, includes a highly reflective metal. For example, Ag or an Ag alloy can be used as the highly reflective metal. However, the present invention is not limited thereto. Any other reflective metal can be alternatively used as long as the reflective metal has high reflectance equivalent to that of Ag. Since the first electrode metal layer 1450 includes a highly reflective metal, emission efficiency of each emission portion can be improved in a display device in which the area of the emission portions is reduced by the provision of a transmissive portion. Also, in the display device according to the present invention, as shown in FIGS. 7E and 8E, the first electrode metal layer 1450 is removed from an auxiliary connection portion CNP, whereby the gap portion and a protrusion thereon are configured independently of the first electrode metal layer 1450. Consequently, it is possible to prevent deformation of the highly reflective electrode when protruding as a tip and to stabilize connection between a second electrode 160 of the auxiliary connection portion CNP and the auxiliary electrode 120.

As shown in FIGS. 7E and 8E, the second metal layer 1202, among the metal layers constituting the auxiliary electrode 120, is applied to an etchant having a relatively high etching rate when the first electrode metal layer 1450 is removed from the auxiliary connection portion CNP in order to remove some of the width of the second metal layer 1202 such that the second metal layer is introduced into the passivation film 125, whereby the gap portion UC is defined in the region between the third metal layer 1203 and the first metal layer 1201 from which the second metal layer 1202 is removed.

Figure 7F:
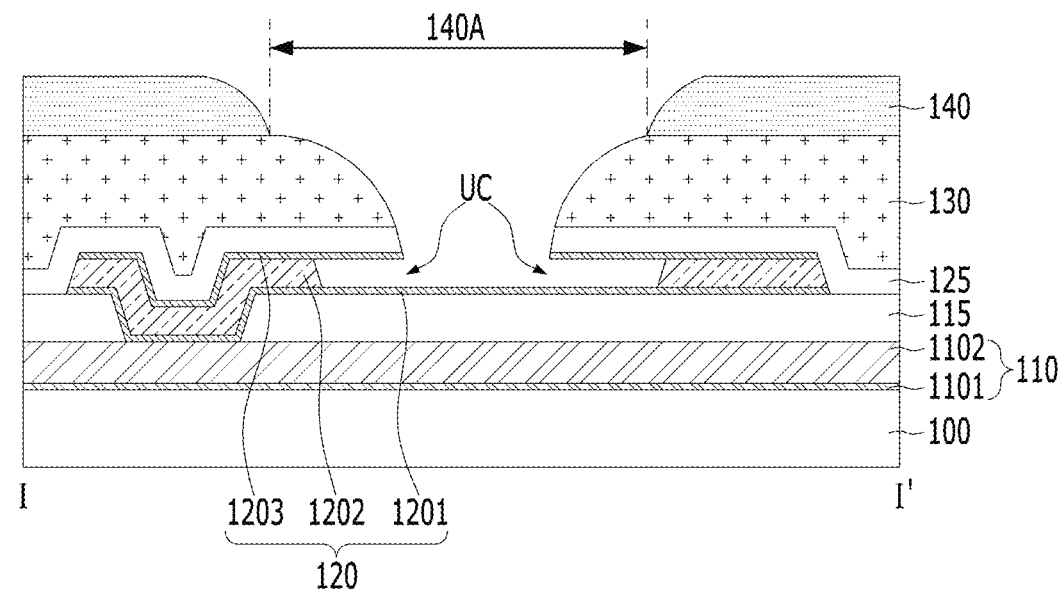
Figure 8F:
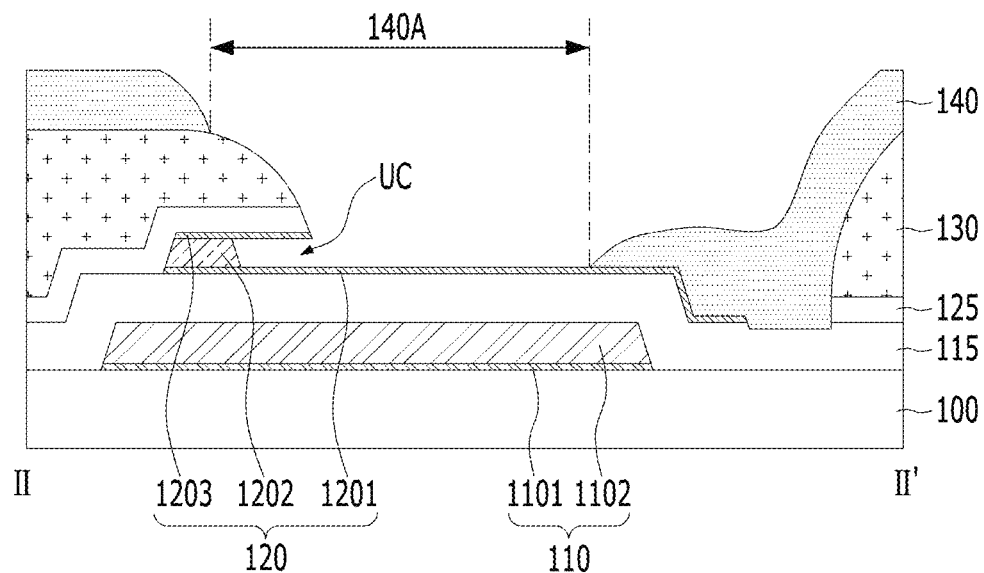

Subsequently, as shown in FIGS. 7F and 8F, the side of the overcoat layer 130 having a larger width than the first hole 130A in the I-I' direction and formed in the first hole 130A having the gap portion UC in the II-II' direction is exposed, and the side of the overcoat layer 130 is covered at the other side thereof, whereby a bank 140 having a second hole 140A is formed. In the same process as the process of forming the bank 140, each of the emission portions E and the transmissive portion T can have a hole (open region) having an area corresponding to the emission portions E and the transmissive portion T of the bank 140.

Meanwhile, the method of manufacturing the display device according to the second embodiment is related to the auxiliary connection portion CNP. The constructions of the thin film transistor TFT, the emission portions E, the transmissive portion T, the storage capacitor Cst, and the pad unit PAD are based on a description of FIG. 2.

As shown in FIGS. 7F and 8F, an organic layer 150 and a second electrode 160 are sequentially formed on the bank 140, and the second electrode 160 is further introduced into the gap portion UC so as to have direct connection DTC with the first metal layer 1201.

As shown in FIG. 2, inorganic encapsulation films 211 and 213 and an organic encapsulation film 212 can be alternately stacked on the second electrode 160 to form an encapsulation layer structure 200. At this time, the inorganic encapsulation film 211 is further introduced into the gap portion UC, whereby it is possible to achieve a hermetic seal, to prevent permeation of moisture, and to protect the gap portion UC.

Meanwhile, in the structure of the display device, light blocking layers 110, 111, 113, and 114 are used as data lines DL, a power voltage line VDDL, and a ground voltage line VSSL, respectively. In this structure, the light blocking layers and the wire layers are located on the common layer, whereby it is possible to reduce the number of wires used in the display device and to reduce the number of masks.

Unlike the above embodiment, the light blocking layers and the gate line/the data lines can be provided on different layers.

Figure 9:
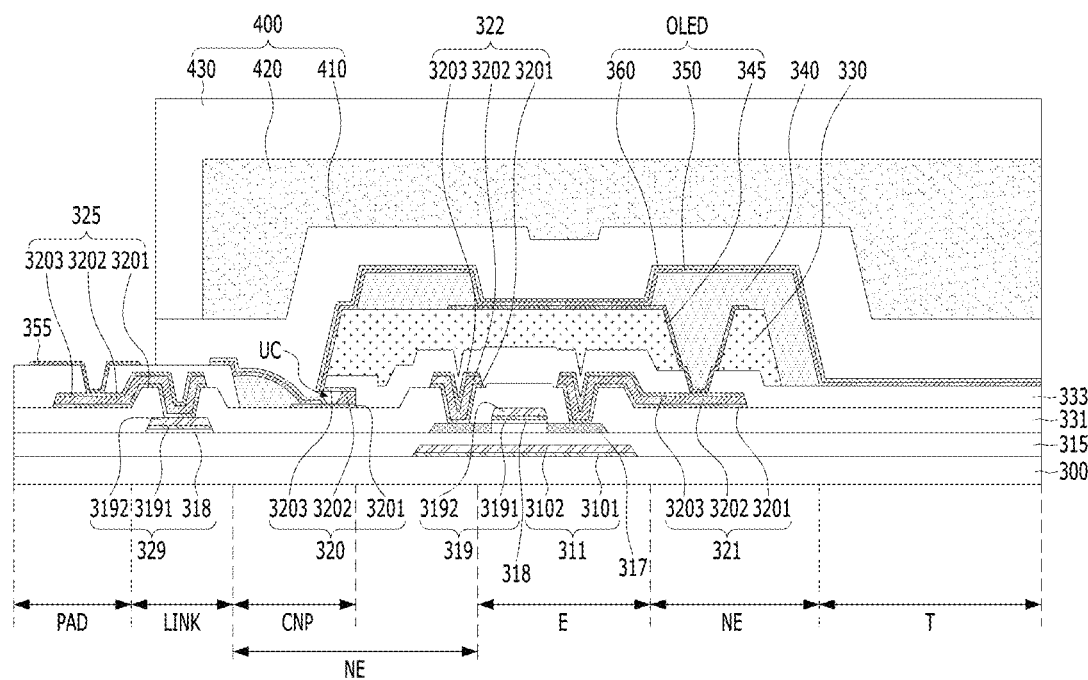
FIG. 9 is a sectional view of a display device according to a third embodiment of the present invention.

FIG. 9 is a sectional view of a display device according to a third embodiment of the present invention.

In the display device according to the third embodiment of the present invention, as shown in FIG. 9, a light blocking layer 311 is provided under a semiconductor layer 317 of a thin film transistor, a gate line is formed so as to be integrated with a gate electrode 319 of the thin film transistor, and a source electrode 322 and a drain electrode 321 are formed on the same layer as data lines DL1 and DL2 (see FIG. 1).

A gate dielectric film 318 is interposed between the gate electrode 319 and the semiconductor layer 317.

The light blocking layer 311 can include two or more metal layers 3101 and 3102 having high conductivity.

Each of the gate electrode 319 and a link wire 329 can include two or more metal layers 3191 and 3192 having high conductivity, similarly to the light blocking layer 311.

Each of the source electrode 322 and the drain electrode 321 can include a first to third metal layers 3201, 3202, and 3203, whereby an auxiliary electrode 320 can have a construction similar to the construction of the auxiliary electrode according to each of the first and second embodiments. For example, a gap portion UC is defined in a region between the third metal layer 3203 and the first metal layer 3201 from which the second metal layer 3202, which has a thickness of 4000 Å to 7000 Å, is removed, and a second electrode 360 is introduced into the gap portion UC more than an organic layer 350, whereby direct connection between the second electrode 360 and the first metal layer 3201 can be performed. The structure of each of the source electrode 322 and the drain electrode 321, in which the first to third metal layers 3201, 3202, and 3203 are stacked, can extend from a link unit LINK and a pad unit PAD to a first pad electrode 325, and a second pad electrode 355 made of a metal on the same layer as a first electrode 345 of a light-emitting device OLED can be further provided on the first pad electrode 325.

A first interlayer dielectric film 315 can be provided between the light blocking layer 311 and the semiconductor layer 317, a gate dielectric film 318 can be provided between the semiconductor layer 317 and the gate electrode 319, a second interlayer dielectric film 331 can be provided between the gate electrode 319 and the source/drain electrode 322 and 321, and a passivation film 333 can be formed so as to overlay the source/drain electrode 322 and 321 and the auxiliary electrode 320. An overcoat layer 330 for surface planarization is formed on the passivation film 333.

In an active area including an auxiliary connection portion CNP, emission portions E, and a transmissive portion T, the overcoat layer 330 and the passivation film 333 can be patterned using the same mask, and can have the same width.

In addition, a bank 340 that opens the emission portions E and the transmissive portion T covers a part of the first metal layer 3201 at the side of the auxiliary connection portion CNP different from the gap portion UC, whereby an organic layer 350 and a second electrode 360 are formed along the side at which the bank 340 is formed. The second electrode 360, which has relatively high step coverage, is further introduced into the gap portion UC so as to have direct connection with the first metal layer 3201.

Meanwhile, the first electrode 345, the organic layer 350, and the second electrode 360 stacked at each emission portion E constitute a light-emitting device OLED, which emits light.

In addition, an encapsulation layer structure 400, in which inorganic encapsulation layers 410 and 430 and an organic encapsulation layer 420 are alternately disposed, is formed on the second electrode 360, including the light-emitting device OLED, so as to encapsulate the light-emitting device OLED.

In the display device according to the third embodiment, the structure and function of the auxiliary connection portion CNP are similar except that the gate line (gate electrode), the data lines, and the source/drain electrode are formed on a layer different from the light blocking layer 311.

For example, although the auxiliary connection portion CNP is not shown, a ground voltage line VSSL having a function of transmitting ground voltage VSS and the auxiliary electrode 320 can be located on the same layer, or the ground voltage line and the auxiliary electrode 320 located on different layers can be connected to each other such that a ground voltage signal is applied.

In addition, the auxiliary electrode 320 is shown as having a triple layer structure. However, the present invention is not limited thereto. Only two metal layers having different etching properties can be provided, and a second metal layer, which is an upper layer, can be selectively removed, and the passivation film located thereon can protrude more than the second metal layer so as to define the gap portion UC. The auxiliary electrode 320 can include four or more layers, and an inorganic dielectric film or a metal layer located thereon can be formed so as to protrude more than the metal layer in which the gap portion is defined. In this case, the vertical distance of the gap portion is greater than the thickness of the organic layer, whereby the organic layer has a physical distance between the passivation film 333 and the first metal layer under the gap portion UC in the vertical space of the gap portion.

Meanwhile, in the display device according to the present invention, when the first electrode (anode) includes a highly reflective metal such that emission portions driven in an upper emission structure have high-efficiency properties, the highly reflective metal is prevented from being oxidized after being formed or is prevented from being deformed in a bank firing process in the case in which the highly reflective metal has a tip structure. To this end, an auxiliary electrode including a gap portion is formed on a metal layer constituting the gate line or the data line thereunder irrespective of the first electrode.

For example, the gap portion UC is defined in the space between the passivation film 333 or the third metal layer 3203 and the first metal layer 3201 from which the second metal layer 3202 is removed. In this case, the third metal layer 3203 remaining thereon is made of a metal having high conductivity, such as aluminum (Al), chromium (Cr), copper (Cu), titanium (Ti), molybdenum (Mo), or tungsten (W), or an alloy including at least one of the metals, which is hardly deformed in a subsequent process of firing the bank 340. Consequently, the vertical gap of the gap portion UC is maintained even after the bank 340 is formed, the organic layer 350, which is subsequently deposited while having straightness is prevented from being introduced into the gap portion UC, and the second electrode 360 is introduced into the gap portion UC, whereby the outside of the organic layer 350 and the first metal layer 3201 are directly connected to each other, and therefore electrical connection of the auxiliary electrode 220 is stably performed.

Consequently, the display device according to one or more embodiments of the present invention has an effect in that the area of the transmissive portion is increased, whereby transmittance is improved, and an effect in that emission efficiency of the emission portions is improved and at the same time lowering in voltage of the second electrode, which is commonly used for the emission portions and the transmissive portion, is prevented.

At this time, ground voltage is applied to the second electrode 160 through the light blocking layer 110, which applies ground voltage in the auxiliary connection portion CNP, and the auxiliary electrode 120, which has the first connection CT1 with the light blocking layer 110.

An overcoat layer 130 for planarization can be formed on the passivation film 125, a contact hole configured to connect the drain electrode 124 of the thin film transistor and the first electrode 145 to each other is formed through the overcoat layer 130 and the passivation film 125, and third connection CT3 can be provided through the contact hole. When the contact hole is formed through the overcoat layer 130 and the passivation film 125, the overcoat layer 130 and the passivation film 125 are patterned, whereby the first hole 130A can be formed. The first electrode 145 is formed on the overcoat layer 130 excluding the region of the third connection CT3 corresponding to the contact hole. The first electrode 145 of the display device according to an example of the present invention includes a highly-reflective electrode, such as Ag or an Ag alloy, in order to improve emission efficiency based on the area of the emission portions reduced by the provision of the transmissive portion. However, the present invention is not limited thereto, and a highly-reflective metal equivalent to Ag or an Ag alloy can be used in addition to Ag or the Ag alloy. Although the highly-reflective metal can be formed so as to have a single layer, the upper layer directly contacting the organic layer 150 can include a transparent metal capable of lowering a barrier at the interface contacting the organic layer 150, such as ITO.

In defining the emission portions and the transmissive portion, the bank 140 also defines the second hole 140A in the non-emission portion. Each of the bank 140 and the overcoat layer 130 can be formed of an organic dielectric film, such as polyimide, polyacrylic, or benzocyclobutene (BCB). Depending on circumstances, the bank 140 can include carbon black in order to block light at the region at which the bank 140 is formed.

The gap portion UC can be provided in the region between the passivation film 125 adjacent to the first hole 130A and the first metal layer 1201 from which the second metal layer 1202 is removed. The auxiliary electrode 120 is provided on the light blocking layer 110 so as to overlap therewith, and electrical connection is achieved through first connection CT1 therebetween.

In the display device according to one or more embodiments of the present invention, the second electrode 160 is jointly formed as a single body at the emission portions E and the transmissive portion T. In order to secure a predetermined level or more of transmittance of the transmissive portion T even in the case in which the second electrode 160 is provided at the transmissive portion T, the second electrode 160 can be made of a transparent oxide, such as indium tin oxide (ITO), indium zinc oxide (IZO), indium tin zinc oxide (ITZO), or tin oxide (TO). At each of the emission portions E (GE, WE, BE, and RE), the first electrode 145 of the light-emitting device OLED is selectively formed for the emission portions GE, WE, BE, and RE. In order to increase resonance in an emissive layer between the first electrode 145 and the second electrode 160 without light loss from the emission portions GE, WE, BE, and RE to the rear surface of the substrate 100 such that light exits to the upper side of the second electrode 160, the first electrode 145 is formed so as to include a reflective electrode. In a structure in which the transmissive portion T has a predetermined area and thus the size of each of the emission portions GE, WE, BE, and RE is small, as in the display device according to the present invention, the area of each of the emission portions GE, WE, BE, and RE is small and light loss can occur from the transmissive portion T adjacent thereto to the rear surface, and therefore high-luminance emission efficiency is required. To this end, a reflective electrode having high reflectance, such as Ag or an Ag alloy (e.g. APC) can be used as the reflective metal included in the first electrode 145. The inventors of the present application have found through experimentation that, in defining the gap portion UC in the display device, when the first electrode 145 is provided so as to protrude from the gap portion using the first electrode as a dummy pattern, the reflective electrode, such as Ag or an Ag alloy, constituting the first electrode 145 has low resistance to heat, and a region thereof exposed through processing can be oxidized and thus deformed, whereby it is difficult to protrude the dummy pattern of the first electrode 145 from the gap portion UC, and have changed the construction of the gap portion UC so as to be provided between the passivation film 125 and the auxiliary electrode 120 in consideration thereof. For example, some of the metal layers of the auxiliary electrode 120 on the same layer as the gate line or the data lines DL formed under the first electrode 145 are selectively patterned, and the gap portion UC is defined in the region of the selectively removed metal layers.

Figure 10A:
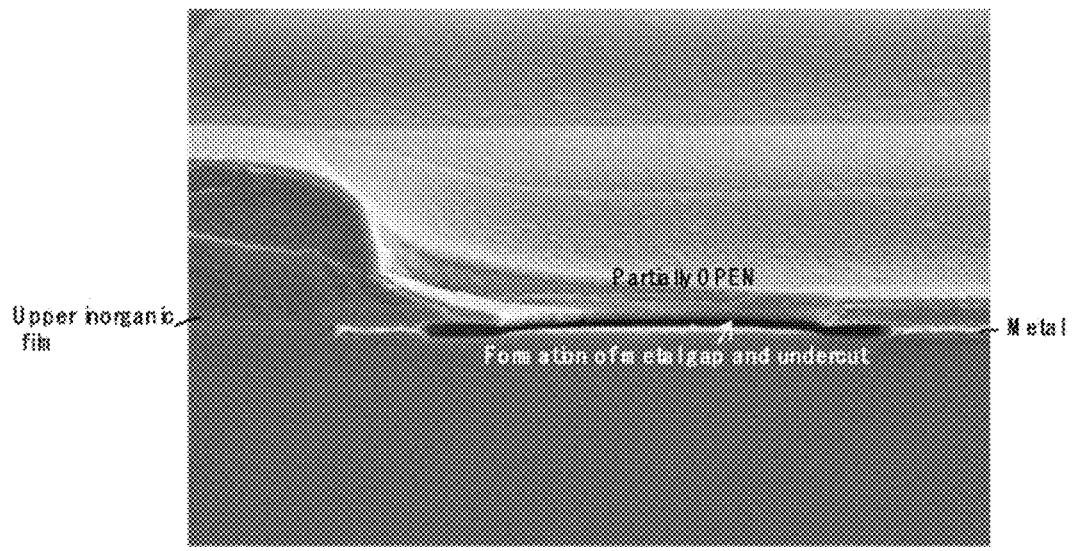
FIGS. 10A and 10B are SEM views showing an undercut structure according to a third experimental example and an enlarged view thereof, respectively.
Figure 10B:
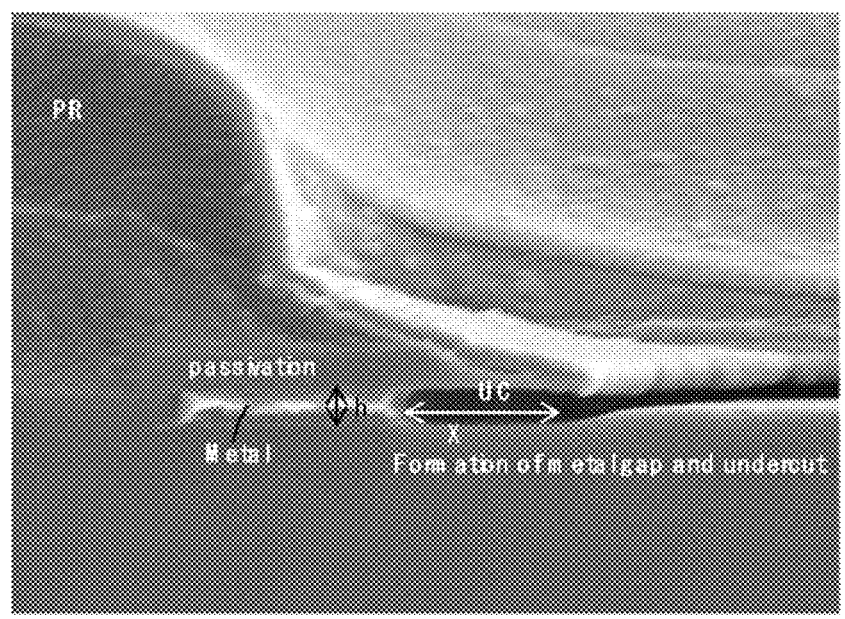

FIGS. 10A and 10B are an SEM view showing an undercut structure according to a third experimental example and an enlarged view thereof.

As shown in FIGS. 10A and 10B, the undercut structure according to the third experimental example is a structure in which a passivation film protrudes more than a single-layer metal having a uniform thickness h. A part of the single-layer metal is removed inwards by a width of x more than a region from which the passivation film is exposed so as to have a gap portion UC. Here, it can be seen that the passivation film protrudes while a tip thereof is stably maintained without sagging or degeneration thereof. For example, the third experimental example shows that the gap portion can be secured using the metal layer and the passivation film is stably located on the metal layer without considerable sagging of the upper inorganic film.

In the display device according to one or more embodiments of the present invention, a first metal layer having different etching properties from the single-layer metal is further formed so as to be located under the gap portion UC, compared to the third experimental example, the auxiliary electrode is secured through the first metal layer, and electrical connection between the first metal layer introduced into the gap portion UC and the second electrode is secured.

A display device according to an embodiment of the present invention includes a substrate including a plurality of pixels, each of which has an emission portion and a non-emission portion around the emission portion, a light-emitting device at the emission portion, the light-emitting device including a first electrode, an organic emissive layer disposed over the first electrode, and a second electrode disposed over the organic emissive layer, an auxiliary electrode lower than the first electrode at the non-emission portion, the auxiliary electrode including a first metal layer and a second metal layer on the first metal layer, the second metal layer having a smaller area than the first metal layer, a passivation film to protrude more than the second metal layer, the passivation film to expose a part of the first metal layer, and a gap portion at the side of the second metal layer between the passivation film and the first metal layer, wherein the second electrode is introduced into the gap portion in the non-emission portion to be connected to the first metal layer of the auxiliary electrode.

The vertical distance of the gap portion can be the thickness of the second metal layer.

The auxiliary electrode can be located on the same layer as at least one of a gate line and a data line.

The first electrode can include a plurality of metal layers, at least one of the plurality of metal layers can include silver, and the second electrode can be a transparent electrode.

At least one of the plurality of pixels can include a transmissive portion, and the second electrode can be provided as a single body for the plurality of pixels over the emission portions, the transmissive portions, and the non-emission portions.

The auxiliary electrode may not overlap the first electrode.

The first and second metal layers of the auxiliary electrode can be made of different metals, the auxiliary electrode can further include a third metal layer disposed on the second metal layer, the third metal layer being made of the same metal as the first metal layer, and the third metal layer can protrude from the second metal layer so as to overlap the gap portion.

A bank configured to expose the emission portion and the transmissive portion can expose both the gap portion and the first metal layer extending to one side while overlapping the gap portion and can overlay the remaining region in the non-emission portion.

In addition, a display device according to an embodiment of the first embodiment of the present invention includes a substrate including a plurality of pixels, each of which has a plurality of emission portions to emit different colors and a transmissive portion neighboring the plurality of emission portions, a first electrode provided at each of the plurality of emission portions, an auxiliary electrode at a non-emission portion, the auxiliary electrode including a first metal layer and a second metal layer on the first metal layer, the second metal layer having a smaller area than the first metal layer, a passivation film over the second metal layer to protrude more than the second metal layer, the passivation film to expose a part of the first metal layer, a gap portion at the side of the second metal layer between the passivation film and the first metal layer, a bank to expose the gap portion and a part of the first metal layer on the passivation film, the bank being at the non-emission portion, an organic layer over the bank and the exposed first metal layer, and a second electrode over the organic layer, a part of the second electrode being introduced into the gap portion to be connected to the first metal layer.

The vertical distance of the gap portion can be the thickness of the second metal layer.

The first electrode can be electrically connected to a gate line and a data line, and the auxiliary electrode can be located on the same layer as at least one of the gate line and the data line.

The first electrode can include a plurality of metal layers, at least one of the plurality of metal layers can include silver, and the second electrode can be a transparent electrode.

The auxiliary electrode can have a vertical connection portion connected to a light blocking layer located under the auxiliary electrode.

As is apparent from the above description, a display device according to the present invention has the following effects.

In the display device according to the present invention, when the first electrode has a highly reflective metal such that emission portions driven in an upper emission structure have high-efficiency properties, the highly reflective metal is prevented from being oxidized after being formed or is prevented from being deformed in a bank firing process in the case in which the highly reflective metal has a tip structure. For example, the auxiliary electrode having the gap portion is formed on the metal layer constituting the gate line or the data line thereunder irrespective of the first electrode, whereby it is possible to prevent the first electrode from protruding outwards in a tip-shaped structure.

In the display device according to one or more embodiments of the present invention, the middle metal layer between the inorganic dielectric film or the upper metal layer and the lower metal layer is removed, whereby the gap portion is defined. In this case, the upper metal layer remaining on the gap portion is made of a metal having high conductivity, such as aluminum (Al), chromium (Cr), copper (Cu), titanium (Ti), molybdenum (Mo), or tungsten (W), or an alloy including at least one of the metals, which is hardly deformed in a subsequent bank firing process. Consequently, the vertical gap of the gap portion is stably maintained even after the bank is formed, the organic layer, which is subsequently deposited while having straightness is prevented from being introduced into the gap portion, and the second electrode is introduced into the gap portion, whereby the outside of the organic layer and the lower metal layer are directly connected to each other, and therefore electrical connection of the auxiliary electrode is stably performed. As a result, it is possible to increase the lifespan of the display and to prevent the occurrence of an afterimage.

In addition, the display device according to one or more embodiments of the present invention has an effect in that the area of the transmissive portion is increased, whereby transmittance is improved, and an effect in that emission efficiency of the emission portions is improved and at the same time lowering in voltage of the second electrode, which is commonly used for the emission portions and the transmissive portion, is prevented.

The gap portion is formed on the same layer as the gate line or data line metal layer, whereby it is possible to realize a voltage lowering prevention structure while not increasing the number of masks without addition of a separate wire or a separate inorganic film.

In addition, efficiency of each emission portion is secured through the use of a highly reflective metal although the area of each emission portion is small, whereby it is possible to increase the area of the transmissive portion, and therefore it is possible to increase an opening area in a transparent display device and, in addition, to improve transmission efficiency.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. A display device comprising:
a substrate comprising a plurality of pixels, each pixel having an emission portion and a non-emission portion around the emission portion;
a light-emitting device at the emission portion of the substrate, the light-emitting device comprising a first electrode, an organic emissive layer over the first electrode, and a second electrode over the organic emissive layer;
an auxiliary electrode disposed lower than the first electrode at the non-emission portion, the auxiliary electrode comprising a first metal layer and a second metal layer on the first metal layer, the second metal layer having a smaller area than the first metal layer;
a passivation film to protrude more than the second metal layer, and configured to expose a part of the first metal layer; and
a gap portion at a side of the second metal layer between the passivation film and the first metal layer,
wherein the second electrode is introduced into the gap portion in the non-emission portion to be connected to the first metal layer of the auxiliary electrode, and
wherein the gap portion exposes the side of the second metal layer.

2. The display device according to claim 1, wherein a vertical distance of the gap portion is a thickness of the second metal layer.

3. The display device according to claim 1, wherein the auxiliary electrode is located at a same layer as at least one of a gate line and a data line.

4. The display device according to claim 1, wherein
the first electrode comprises a plurality of metal layers, at least one of the plurality of metal layers comprising silver, and
the second electrode is a transparent electrode.

5. The display device according to claim 1, wherein
at least one of the plurality of pixels comprises a transmissive portion, and
the second electrode is provided as a single body for the plurality of pixels over the emission portion, the transmissive portion, and the non-emission portion.

6. The display device according to claim 1, wherein the auxiliary electrode does not overlap the first electrode.

7. The display device according to claim 1, wherein
the first and second metal layers of the auxiliary electrode are made of different metals,
the auxiliary electrode further comprises a third metal layer on the second metal layer, the third metal layer being made of a same metal as the first metal layer, and
the third metal layer protrudes from the second metal layer so as to overlap the gap portion.

8. The display device according to claim 1, further comprising:
a bank to expose the emission portion and the transmissive portion,
wherein the bank exposes both the gap portion and the first metal layer extending to one side while overlapping the gap portion, and covers a remaining region in the non-emission portion.

9. A display device comprising:
a substrate comprising a plurality of pixels, each pixel having a plurality of emission portions to emit different colors and a transmissive portion neighboring the plurality of emission portions;
a first electrode at each of the plurality of emission portions;
an auxiliary electrode at a non-emission portion, the auxiliary electrode comprising a first metal layer and a second metal layer on the first metal layer, the second metal layer having a smaller area than the first metal layer;
a passivation film over the second metal layer to protrude more than the second metal layer, and configured to expose a part of the first metal layer;
a gap portion at a side of the second metal layer between the passivation film and the first metal layer;
a bank to expose the gap portion and a part of the first metal layer over the passivation film, the bank disposed at the non-emission portion;
an organic layer over the bank and the exposed first metal layer; and a second electrode provided over the organic layer, a part of the second electrode being introduced into the gap portion to be connected to the first metal layer.

10. The display device according to claim 9, wherein a vertical distance of the gap portion is a thickness of the second metal layer.

11. The display device according to claim 9, wherein the auxiliary electrode is located at a same layer as at least one of a gate line and a data line intersecting each pixel.

12. The display device according to claim 9, wherein at least one of the gate line and the data line intersecting each pixel is a light blocking layer.

13. The display device according to claim 9, wherein
the first electrode comprises a plurality of metal layers, at least one of the plurality of metal layers comprising silver, and
the second electrode is a transparent electrode.

14. The display device according to claim 9, wherein the auxiliary electrode has a vertical connection portion connected to a light blocking layer under the auxiliary electrode.

15. A display device comprising:
a substrate comprising a plurality of pixels, each pixel having an emission portion and a non-emission portion around the emission portion;
a light-emitting device at the emission portion of the substrate, the light-emitting device comprising a first electrode, an organic emissive layer over the first electrode, and a second electrode over the organic emissive layer;
an auxiliary electrode disposed lower than the first electrode at the non-emission portion, the auxiliary electrode comprising a first metal layer and a second metal layer on the first metal layer, the second metal layer having a smaller area than the first metal layer;
a passivation film to protrude more than the second metal layer, and configured to expose a part of the first metal layer; and
a gap portion at a side of the second metal layer between the passivation film and the first metal layer,
wherein the second electrode is introduced into the gap portion in the non-emission portion to be connected to the first metal layer of the auxiliary electrode,
wherein:
the first and second metal layers of the auxiliary electrode are made of different metals,
the auxiliary electrode further comprises a third metal layer on the second metal layer, the third metal layer being made of a same metal as the first metal layer, and
the third metal layer protrudes from the second metal layer so as to overlap the gap portion.

* * * * *